United States Patent
Novak et al.

(10) Patent No.: US 6,215,373 B1
(45) Date of Patent: Apr. 10, 2001

(54) METHOD FOR EDGE TERMINATION OF PARALLEL CONDUCTIVE PLANES INCLUDING ESTIMATING THE CHARACTERISTIC IMPEDANCE OF THE STRUCTURE

(75) Inventors: Istvan Novak, Maynard, MA (US); Wai-Yeung Yip, Sunnyvale, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/246,654

(22) Filed: Feb. 8, 1999

Related U.S. Application Data

(63) Continuation-in-part of application No. 09/081,372, filed on May 19, 1998, now Pat. No. 6,104,258.

(51) Int. Cl.[7] ............................... H03H 1/02; H03H 7/38
(52) U.S. Cl. ........................................... 333/22 R; 333/12
(58) Field of Search ........................ 33/12, 22 R, 81 A, 33/246

(56) References Cited

U.S. PATENT DOCUMENTS

| | | | |
|---|---|---|---|
| 4,371,746 | 2/1983 | Pepper, Jr. | 178/18 |
| 5,114,912 | 5/1992 | Benz | 505/1 |
| 5,266,036 | 11/1993 | Lichtenwalter et al. | 439/65 |
| 5,708,400 | 1/1998 | Morris | 333/12 |
| 5,818,315 * | 10/1998 | Moongilan | 333/1 X |

OTHER PUBLICATIONS

Lee et al. "Modeling and Analysis of Multichip Module Power Supply Planes," IEE Transactions on Components, Packaging, and Manufacturing Tech.–Part B, vol. 18, No. 4, pp. 628–639, Nov. 1995.*

Ramo et al., *Fields and Waves in Communication Electronics*, Third Edition, John Wiley & Sons, Inc., 1994, Chapter 9, pp. 464–467.

(List continued on next page.)

*Primary Examiner*—Justin P. Bettendorf
(74) *Attorney, Agent, or Firm*—Conley, Rose & Tayon, PC; B. Noel Kivlin

(57) ABSTRACT

A system and method are presented for stabilizing the electrical impedance of a structure (e.g., an electrical interconnecting apparatus) including a pair of parallel planar conductors separated by a dielectric layer. The structure may be, for example, a PCB, a component of a semiconductor device package, or formed upon a surface of an integrated circuit substrate. An electrical resistance connected between the planar conductors about a periphery of the structure serves to stabilize the electrical impedance of the structure, thereby reducing an amount of electromagnetic energy radiated from the structure. The electrical resistance may be multiple discrete electrical resistances dispersed about the periphery of the structure, and the structure need not be rectangular. For example, a portion of the periphery of the structure may define a curve. A general method for stabilizing the electrical impedance of the structure includes selecting a spacing distance. A grid is generated by superimposing two orthogonal sets of parallel lines upon one another, wherein the parallel lines within each set are separated by the spacing distance. The grid is dimensioned such that it completely covers the structure when overlayed upon the structure. The characteristic impedance of the structure may then be estimated using a physical dimension of the grid. The value of the electrical resistance may then be computed using the estimated characteristic impedance of the structure. The grid may also be used to determine the location of the discrete electrical resistances.

32 Claims, 15 Drawing Sheets

OTHER PUBLICATIONS

Franz et al., "An Approach to Determine Decoupling Effects of VCC and VGG Structures in Multilayer Technique," Proceedings of the 1994 EMC Symposium, May 1994, pp. 56–59.

Fang et al., "Effects of Losses in Power and Ground Planes in the Simulation of Simultaneous Switching Noise," Proceedings of the 3rd Topical Meeting on Electrical Performance of Electronic Packaging, 1994 pp. 110–112.

Bandyopadhyay et al., "Importance of Damping and Resonance in Thin–Film Integrated Decoupling Capacitor Design," 6th Topical Meeting on Electrical Performance of Electrical Packaging, Oct. 1997, pp. 31–34.

O'Sullivan et al., "Developing a Decoupling Methodology with SPICE for Multilayer Printed Circuit Boards," Proceedings of the 1998 International Symposium on Electromagnetic Compatibility, Aug. 1998, pp. 652–655.

Lei et al., "Power Distribution Noise Suppression Using Transmission Line Termination Techniques," Proceedings of the 5th Topical Meeting on the Electrical Performance of Electrical Packaging Oct. 1996, pp. 100–102.

International Search Report for Application No. PCT/US99/10937 mailed Sep. 8,1999.

* cited by examiner

METHOD FOR EDGE TERMINATION OF PARALLEL CONDUCTIVE PLANES INCLUDING ESTIMATING THE CHARACTERISTIC IMPEDANCE OF THE STRUCTURE

CONTINUATION DATA

This patent application is a continuation-in-part to application Ser. No. 09/081,372 now U.S. Pat. No. 6,104,258 entitled "System and Method for Edge Termination of Parallel Conductive Planes in an Electrical Interconnecting Apparatus" by Istvan Novak filed May 19, 1998.

BACKGROUND OF THE INVENTION

1. Field of the Invention

This invention relates to electronic systems, and more particularly to electrical interconnecting apparatus having continuous planar conductors.

2. Description of the Related Art

Electronic systems typically employ several different types of electrical interconnecting apparatus having planar layers of electrically conductive material (i.e., planar conductors) separated by dielectric layers. A portion of the conductive layers may be patterned to form electrically conductive signal lines or "traces". Conductive traces in different layers (i.e., on different levels) are typically connected using contact structures formed in openings in the dielectric layers (i.e., vias). For example, integrated circuits typically have several layers of conductive traces which interconnect electronic devices formed upon and within a semiconductor substrate. Each layer is separated from adjacent layers by dielectric layers. Within a semiconductor device package, several layers of conductive traces separated by dielectric layers may be used to electrically connect bonding pads of an integrated circuit to terminals (e.g., pins or leads) of the device package. Printed circuit boards also typically have several layers of conductive traces separated by dielectric layers. The conductive traces are used to electrically interconnect terminals of electronic devices mounted upon the PCB.

Signals in digital electronic systems typically carry information by alternating between two voltage levels (i.e., a low voltage level and a high voltage level). A digital signal cannot transition instantaneously from the low voltage level to the high voltage level, or vice versa. The finite amount of time during which a digital signal transitions from the low voltage level to the high voltage level is called the rise time of the signal. Similarly, the finite amount of time during which a digital signal transitions from the high voltage level to the low voltage level is called the fall time of the signal.

Digital electronic systems are continually being produced which operate at higher signal frequencies (i.e., higher speeds). In order for the digital signals within such systems to remain stable for appreciable periods of time between transitions, the rise and fall times of the signals must decrease as signal frequencies increase. This decrease in signal transition times (i.e., rise and fall times) creates several problems within digital electronic systems, including signal degradation due to reflections, power supply "droop", ground "bounce", and increased electromagnetic emissions.

A signal driven upon (i.e., launched) from a source end of a conductive trace suffers degradation when a portion of the signal reflected from a load end of the trace arrives at the source end after the transition is complete (i.e., after the rise time or fall time of the signal). A portion of the signal is reflected back from the load end of the trace when the input impedance of the load does not match the characteristic impedance of the trace. When the length of a conductive trace is greater than the signal transition time (i.e., the rise or fall time) divided by about 20 times the delay per unit length along the trace, the effects of reflections upon signal integrity (i.e., transmission line effects) should be considered. If necessary, steps should be taken to minimize the degradations of signals conveyed upon the trace due to reflections. The act of altering impedances at the source or load ends of the trace in order to reduce signal reflections is referred to as "terminating" the trace. For example, the input impedance of the load may be altered to match the characteristic impedance of the trace in order to prevent signal reflection. As the transition time (i.e., the rise or fall time) of the signal decreases, so does the length of trace which must be terminated in order to reduce signal degradation.

A digital signal alternating between the high and low voltage levels includes contributions from a fundamental sinusoidal frequency (i.e., a first harmonic) and integer multiples of the first harmonic. As the rise and fall times of a digital signal decrease, the magnitudes of a greater number of the integer multiples of the first harmonic become significant. As a general rule, the frequency content of a digital signal extends to a frequency equal to the reciprocal of n times the transition time (i.e., rise or fall time) of the signal. For example, a digital signal with a 1 nanosecond transition time has a frequency content extending up to about 318 MHz.

All conductors have a certain amount of inductance. The voltage across the inductance of a conductor is directly proportional to the rate of change of current through the conductor. At the high frequencies present in conductors carrying digital signals having short transition times, a significant voltage drop occurs across a conductor having even a small inductance. A power supply conductor connects one terminal of an electrical power supply to a power supply terminal of a device, and a ground conductor connects a ground terminal of the power supply to a ground terminal of the device. When the device generates a digital signal having short transition times, high frequency transient load currents flow in the power supply and ground conductors. Power supply droop is the term used to describe the decrease in voltage at the power supply terminal of the device due to the flow of transient load current through the inductance of the power supply conductor. Similarly, ground bounce is the term used to describe the increase in voltage at the ground terminal of the device due to the flow of transient load current through the inductance of the ground conductor. When the device generates several digital signals having short transition times simultaneously, the power supply droop and ground bounce effects are additive. Sufficient power supply droop and ground bounce can cause the device to fail to function correctly.

Power supply droop is commonly reduced by arranging power supply conductors to form a crisscross network of intersecting power supply conductors (i.e., a power supply grid). Such a grid network has a lower inductance, hence power supply droop is reduced. A continuous power supply plane may also be provided which has an even lower inductance than a grid network. Placing a "bypass" capacitor near the power supply terminal of the device is also used to reduce power supply droop. The bypass capacitor supplies a substantial amount of the transient load current, thereby reducing the amount of transient load current flowing through the power supply conductor. Ground bounce is reduced by using a low inductance ground conductor grid network, or a continuous ground plane having an even lower amount of inductance. Power supply and ground grids or planes are commonly placed in close proximity to one another in order to further reduce the inductances of the grids or planes.

Electromagnetic interference (EMI) is the term used to describe unwanted interference energies either conducted as currents or radiated as electromagnetic fields. High frequency components present within circuits producing digital signals having short transition times may be coupled into nearby electronic systems (e.g., radio and television circuits), disrupting proper operation of these systems. The United States Federal Communication Commission has established upper limits for the amounts of EMI products for sale in the United States may generate.

Signal circuits form current loops which radiate magnetic fields in a differential mode. Differential mode EMI is usually reduced by reducing the areas proscribed by the circuits and the magnitudes of the signal currents. Impedances of power and ground conductors create voltage drops along the conductors, causing the conductors to radiate electric fields in a common mode. Common mode EMI is typically reduced by reducing the impedances of the power and ground conductors. Reducing the impedances of the power and ground conductors thus reduces EMI as well as power supply droop and ground bounce.

Within the wide frequency range present within electronic systems with digital signals having short transition times, the electrical impedance between any two parallel conductive planes (e.g., adjacent power and ground planes) may vary widely. The parallel conductive planes may exhibit multiple electrical resonances, resulting in alternating high and low impedance values. Parallel conductive planes tend to radiate a significant amount of differential mode EMI at their boundaries (i.e., from their edges). The magnitude of differential mode EMI radiated from the edges of the parallel conductive planes varies with frequency and is directly proportional to the electrical impedance between the planes.

FIG. 1 is a perspective view of a pair of 10 in.×10 in. square conductive planes separated by a fiberglass-epoxy composite dielectric layer. Each conductive plane is made of copper and is 0.0014 in. thick. The fiberglass-epoxy composite layer separating the planes has a dielectric constant of 4.0 and is 0.004 in. thick. FIG. 2 is a graph of the magnitude of the simulated electrical impedance between the pair of rectangular conductive planes of FIG. 1 ($\log_{10}$ scale) versus the frequency of a voltage between the planes ($\log_{10}$ scale). The graph was created by modeling each square inch of the pair of conductive planes as a matrix of transmission line segments. The impedance value was computed by simulating the application of a 1 ampere constant current between the centers of the rectangular planes, varying the frequency of the current, and determining the magnitude of the steady state voltage between the centers of the rectangular planes.

As shown in FIG. 2, the magnitude of the electrical impedance between the parallel conductive planes of FIG. 1 varies widely at frequencies above about 20 MHz. The parallel conductive planes exhibit multiple electrical resonances at frequencies between 100 MHz and 1 GHz, resulting in alternating high and low impedance values. The parallel conductive planes of FIG. 1 would radiate substantial amounts of EMI at frequencies where the electrical impedance between the planes anywhere near their peripheries is high.

It would thus be desirable to have a system for stabilizing the electrical impedance between parallel conductive planes.

Such a system would reduce power supply droop, ground bounce, and the amount of electromagnetic energy radiated from the edges of the planes. Such impedance stabilization may also reduce the need for bypass capacitors.

SUMMARY OF THE INVENTION

The problems outlined above are in large part solved by a system and method for stabilizing the electrical impedance of an electrical interconnecting apparatus including a pair of parallel planar conductors separated by a dielectric layer. The electrical interconnecting apparatus may be, for example, a PCB, a semiconductor device package substrate, or an integrated circuit substrate. The present method includes determining a characteristic impedance of the structure. An electrical resistance is then electrically coupled between the planar conductors, wherein the electrical resistance has a value dependent upon the characteristic impedance of the structure. The electrical resistance may be a set of discrete electrical resistances (e.g., resistors) dispersed between regions of the planar conductors near the peripheries, or a continuous "stripe" of electrical resistance between the regions near peripheries.

When the electrical resistance is a set of discrete electrical resistances, the method may include selecting a value for each of the set of electrical resistances and electrically coupling each of the electrical resistances between the regions near the peripheries such that a lateral spacing distance is maintained between the electrical resistances. When the structure is square, the characteristic impedance of the entire structure may be determined, and the spacing distance between the electrical resistances may be computed. The characteristic impedance of the structure may then be multiplied by the ratio of the length of the sides of the structure to the spacing distance, resulting in the value for each of the set of electrical resistances.

The characteristic impedance "$Z_O$" of a pair of square planar conductors in parallel and separated by a dielectric layer may be approximated using:

$$Z_o = Z_{oo}\left(\frac{h}{w\sqrt{\varepsilon_r}}\right)$$

where $Z_{OO}$ is the impedance of free space (120π ohms), h is the distance between the planar conductors, w is the length of each of the sides of the composite structure, and $\varepsilon_r$ is the relative dielectric constant of the dielectric layer. The above equation for $Z_O$ is a low frequency approximation as it is derived using the low frequency (i.e. "static") capacitance between the planar conductors. In the above equation, the characteristic impedance of the planar conductors is thus directly proportional to the distance between the planar conductors and inversely proportional to the lengths of the sides of the composite structure and the square root of the relative dielectric constant of the dielectric layer.

The spacing distance between the electrical resistances may be determined by the wavelength of the highest frequency in a frequency range of interest. For example, the interconnecting apparatus may include a signal layer having electrically conductive traces for conveying signals. The signals have an associated frequency range (i.e., the frequency range of interest). As described above, the frequency content of a digital signal may extend to a frequency equal to the reciprocal of a times the transition time (i.e., rise or fall time) of the signal. The spacing distance between the electrical resistances is preferably made equal to a fraction of the wavelength of the highest frequency in the frequency range of interest. For example, the spacing distance between the electrical resistances may be less than or equal to one tenth of the wavelength of the highest frequency in the frequency range of interest.

When the structure is rectangular but not square, the spacing distance between the electrical resistances may first be determined. The characteristic impedance of a square portion of the structure having sides with lengths equal to the spacing distance may then be computed. The characteristic impedance of the square portion of the structure is the value for each of the set of electrical resistances.

When the electrical resistance is continuous between the regions of the planar conductors near the peripheries, and the structure is rectangular, the characteristic impedance of the entire structure may be determined A resistive "stripe" along a given side of the structure between the regions near the peripheries should provide a resistance per unit length equal to the characteristic impedance of the structure divided by the length of the side. Accordingly, the resistive stripe provides a total resistance along each side of the structure equal to the characteristic impedance of the structure.

An electrical interconnecting apparatus in accordance with the present invention includes an electrical resistance electrically coupled between regions of the planar conductors near peripheries. The electrical resistance has a value dependent upon a characteristic impedance of the planar conductors, and serves to stabilize the electrical impedance of the pair of parallel planar conductors. The electrical resistance may be a set of discrete electrical resistances (e.g., resistors) dispersed between the outer regions. Alternately, the electrical resistance may be a continuous "stripe" of electrical resistance between the outer regions.

In one embodiment, the electrical interconnecting apparatus includes multiple impedance networks dispersed about a region near a periphery of an upper surface of the electrical interconnecting apparatus. The impedance networks are separated by a predetermined spacing distance. A pair of vias is used to electrically connect each impedance network between regions of the planar conductors near peripheries. Each impedance network includes an electrical resistance (e.g., a resistor) having a selected value dependent upon the characteristic impedance of the planar conductors. Each impedance network may also include an electrical capacitance (e.g., a capacitor) in series with the electrical resistance. When the planar conductors are maintained at different direct current (d.c.) potentials, the capacitance prevents a flow of d.c. current between the planar conductors through the impedance networks. The spacing distance between the impedance networks may be determined by the wavelength of the highest frequency in a frequency range of interest as described above.

The electrical interconnecting ads may be, for example, substantially rectangular. In this case, a subset of We impedance networks may reside within a region near a periphery of an upper surface of one side of the electrical interconnecting apparatus. The sum of the electrical resistances of the subset of impedance networks may be made substantially equal to the characteristic impedance of the planar conductors. Members of the subset may be connected together to form a chain of impedance networks.

Each impedance network may include an electrical capacitance C in series with electrical resistance R. In this case, the value of C is preferably determined using the following equation:

$$C > \frac{1}{2\pi \cdot R \cdot f_{res}}$$

where $f_{ref}$ is the lowest resonant frequency of the structure including the planar conductors separated by the dielectric layer. Thus the value of C is preferably inversely related to the value of R. Resonant frequency $f_{ref}$ may be determined experimentally or by computer simulation. In FIG. 2, $f_{res}$ is the frequency where the impedance is minimum, approximately 100 MHz.

In an alternate embodiment of the electrical interconnecting apparatus, a series combination of resistance and capacitance formed between a pair of planar conductors is continuous about the regions near the peripheries of the planar conductors. An electrically resistive layer is positioned between the dielectric layer and one of the planar conductors such that the electrically resistive layer is in contact with the planar conductor. The dielectric layer includes an inner portion and an outer portion, wherein the outer portion is located between the regions near the peripheries of the planar conductors. The dielectric constant of the outer portion of the dielectric layer is greater than the dielectric constant of the inner portion of the dielectric layer. The portion of the electrically resistive layer located between the outer portion of the dielectric layer and the adjacent planar conductor provides an electrical resistance directly proportional to the characteristic impedance of the planar conductors.

The outer portion of the dielectric layer provides an electrical capacitance in series with the resistance. The capacitance per unit length $C_l$ provided by the outer portion of the dielectric layer is preferably dependent upon the resistance per unit length $R_l$ provided by the resistive layer according to the following equation:

$$C_l > \frac{1}{2\pi \cdot R_l \cdot f_{res}}$$

where $f_{res}$ is the lowest resonant frequency of the structure including the planar conductors separated by the dielectric layer. Thus the value of $C_l$ is preferably inversely related to the value of $R_l$.

The structure including a pair of parallel planar conductors separated by a dielectric layer (e.g., electrical interconnecting apparatus) need not be rectangular. For example, a portion of a periphery of the structure may define a curve. A general method for stabilizing the electrical impedance of the structure includes selecting spacing distance s described above. Spacing distance s may, for example, be selected according to:

$$s \leq \frac{c}{10 f_m \sqrt{\varepsilon_r}}$$

wherein c is the speed of light, ƒm is a maximum frequency of a frequency range of interest, and r is the relative dielectric constant of the dielectric layer. A grid including two orthogonal sets of parallel lines superimposed upon one another may then be generated. The parallel lines within each set may be separated by spacing distance s, and the grid may be dimensioned such that it completely covers the structure when overlayed upon the structure. The characteristic impedance of the structure may then be estimated as described above using at least one physical dimension of the grid. For example, the characteristic impedance $Z_O$ of the structure may be estimated using the equation:

$$Z_o = Z_{oo}\left(\frac{h}{w\sqrt{\varepsilon_r}}\right)$$

where w is a dimension of the grid. The value of an electrical resistance coupled between the planar conductors may then be computed as described above based upon the estimated characteristic impedance of the structure.

The grid may be generated by selecting orthogonal first and second dimensions of the structure, preferably such that the product of the first and second dimensions of the structure is minimized. Corresponding first and second dimensions of the grid may then be sized such that they are greater than or equal to the respective first and second dimensions of the structure. As the parallel lines of the grid are separated by spacing distance s, the first and second dimensions of the grid are integer multiples of spacing distance s.

Results of computer simulations show that discrete electrical resistances coupled between portions of the peripheries of structures including pairs of parallel planar conductors separated by dielectric layers are effective in stabilizing the electrical impedance of the structures. Accordingly, the electrical resistance may include multiple discrete electrical resistances dispersed along at least a portion of a periphery of the structure.

When the grid is square, the value of w in the impedance equation above may be the length of each side of the grid, and a nominal value of each of the discrete electrical resistances may be calculated as $Z_O \cdot (w/s)$. Results of computer simulations show that values of the discrete electrical resistances may vary within a range extending from about 0.1 times the nominal value to approximately 100 times the nominal value and still be effective in stabilizing the electrical impedance of the structure. Accordingly, the value of each of the discrete electrical resistances may vary within a range extending from about 0.1 times the nominal value to approximately 100 times the nominal value.

When the grid is not square, the value of w in the impedance equation above may be made equal to spacing distance s, and the resultant estimated characteristic impedance $Z_O$ may be used as the nominal value of each of the discrete electrical resistances. Again, the value of each of the discrete electrical resistances may vary within a range extending from about 0.1 times the nominal value to approximately 100 times the nominal value.

The coupling may include overlaying the grid upon the structure, selecting a location for the electrical resistance at a point within the grid where two orthogonal lines of the grid intersect near the periphery of structure, and moving the location to an adjacent portion of the periphery. Where multiple discrete electrical resistances are to be dispersed along the periphery, the moving may be accomplished such that distances between adjacent discrete electrical resistances are made substantially equal.

BRIEF DESCRIPTION OF THE DRAWINGS

Other objects and advantages of the invention will become apparent upon reading the following detailed description and upon reference to the accompanying drawings in which:

FIG. 18 is a graph of Min |Z| values versus the ratio of the electrical resistance of each of the impedance networks in FIG. 17 to a nominal resistance value (i.e., the logarithm of a normalized resistance value of each impedance network, $\log_{10}$ scale), wherein FIG. 18 shows that the impedance networks having normalized resistance values ranging from about 0.1 to approximately 100 are effective in stabilizing the electrical impedance of the structure in FIG. 17;

FIG. 21 is a graph of the magnitude of the measured electrical impedance between the pair of circular conductive plates of the structure of FIG. 20 ($\log_{10}$ scale) versus the measurement frequency ($\log_{10}$ scale) both with and without impedance networks connected between the plates about a periphery of the structure, wherein FIG. 21 shows that the electrical impedance of the structure of FIG. 20 is stabilized significantly by the additions of the impedance networks;

FIG. 26 is a graph of Min |Z| values versus the number of sides of the structure of FIG. 22 having impedance networks connected between the plates, wherein FIG. 26 shows that: (i) placing impedance networks along only 1 side of the structure provides a minimal amount of impedance stabilization, and (ii) placing impedance networks along at least 2 sides of the structure provides a significant amount of impedance stabilization;

FIG. 32 is a graph of Min |Z| values versus the number of "corners" of the structure of FIG. 27 having impedance networks connected between the plates, wherein FIG. 32 shows that: (i) removing impedance networks from 1 to 3 "corners" of the structure does not have a negative impact on the impedance stabilization provided by the impedance networks, and (ii) removing impedance networks from all 4 "corners" of the structure has only a slight negative impact on the impedance stabilization;

FIG. 34 is a graph of Min |Z| values versus the number of consecutive impedance networks connected between the plates of the structure of FIG. 33, wherein FIG. 34 shows that: (i) placing only 1 or 2 impedance networks along the periphery of the structure provides little impedance stabilization improvement over the unterminated state of the structure, (ii) the impedance stabilization provided by impedance networks is positive and nearly linear when between 3 and 8 impedance networks are placed along the periphery of the structure, (iii) additional impedance networks in excess of 8 further improve impedance stabilization until 14 impedance networks are placed along the periphery of the structure, and (iv) placing impedance networks along the periphery of the structure in excess of 14 provides little or no improvement in impedance stabilization.

Figure 1:
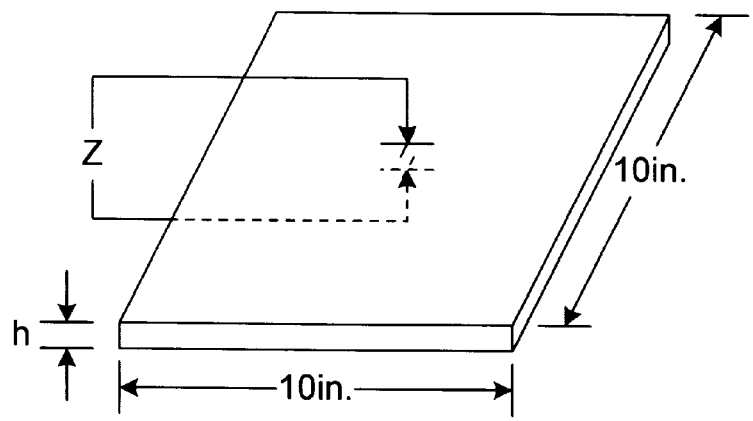
FIG. 1 is a perspective view of a pair of 10 in.×10 in. square conductive planes separated by a fiberglass-epoxy composite dielectric layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
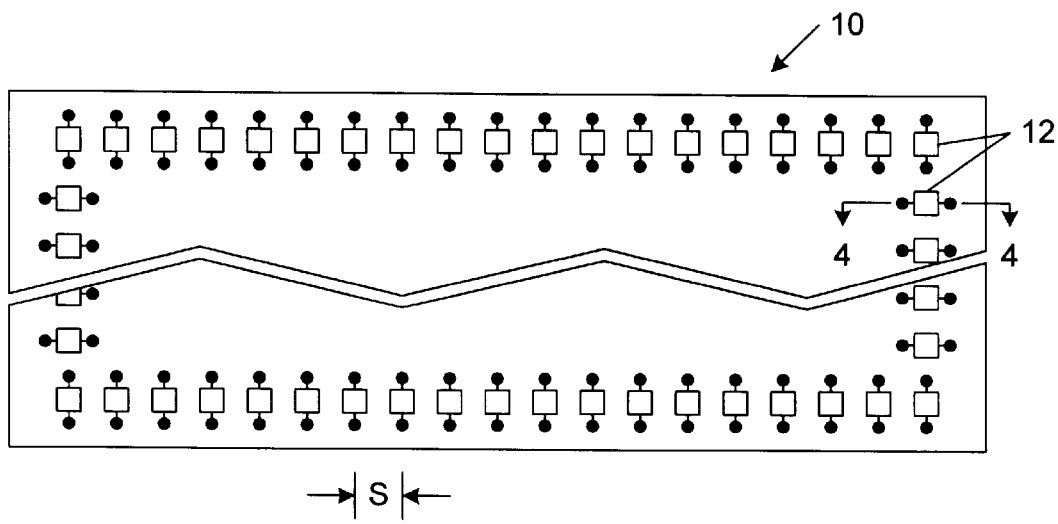
FIG. 3 is a top plan view of one embodiment of an electrical interconnecting apparatus in accordance with the present invention, wherein the interconnecting apparatus includes multiple impedance networks dispersed within a region near a periphery (i.e., an outer edge) of an upper surface.

FIG. 3 is a top plan view of one embodiment of an electrical interconnecting apparatus 10 in accordance with the present invention. Interconnecting apparatus 10 includes multiple layers of planar electrical conductors separated by dielectric layers. At least one of the planar electrical conductors may be pattered to form signal lines (i.e., interconnects or traces). Interconnecting apparatus 10 may be, for example, a PCB, a component of a semiconductor device package, or formed upon a surface of an integrated circuit substrate.

Figure 4:
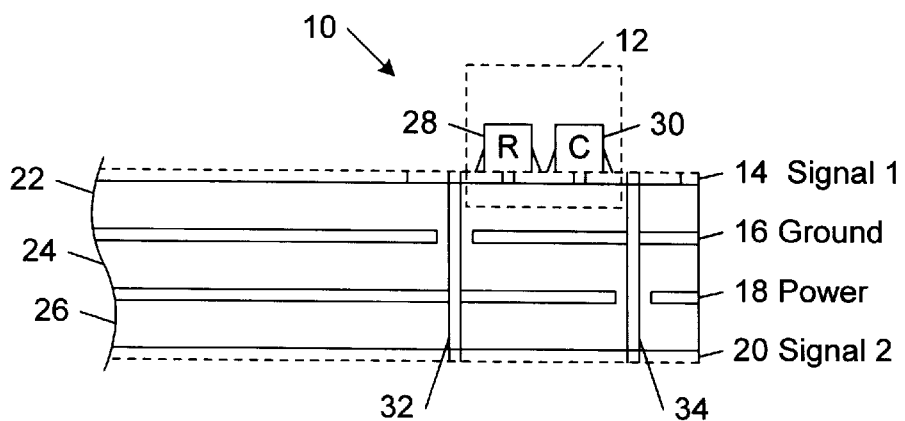
FIG. 4 is a cross sectional view of a portion the interconnecting apparatus of FIG. 3, illustrating the connection of one of the impedance networks between parallel power and ground planes within the interconnecting apparatus.

FIG. 4 is a cross sectional view of a portion interconnecting apparatus 10. In the embodiment of FIG. 4, interconnecting apparatus 10 includes four planar electrical conductors: a first signal plane 14, a ground plane 16, a power plane 18, and a second signal plane 20. During use of interconnecting apparatus 10, power plane 18 is connected to a power terminal of an electrical power supply, and ground plane 16 is connected to a ground terminal of the power supply. Electronic devices connected between power plane 18 and ground plane 16 receive electrical power. Power plane 18 and ground plane 16 are continuous across at least a portion of interconnecting apparatus 10. First signal plane 14 and second signal plane 20 are patterned to form electrically conductive traces as described above. First signal plane 14 and ground plane 16 are separated by a first dielectric layer 22. Ground plane 16 and power plane 18 are separated by a second dielectric layer 24. Power plane 18 and second signal plane 20 are separated by a third dielectric layer 26.

In the embodiment of FIG. 3, interconnecting apparatus 10 includes multiple impedance networks 12 dispersed about a region near a periphery (i.e., an outer edge) of an upper surface of interconnecting apparatus 10. As will be described in detail below, impedance networks 12 are separated by a selected spacing distance "s". FIG. 4 is a cross sectional view of a portion interconnecting apparatus 10 through an impedance network 12. In the embodiment of FIGS. 3 and 4, impedance networks 12 are electrically connected between regions near peripheries of power plane 18 and ground plane 16 by a pair of vertical electrical conductors (i.e., vias). impedance networks 12 are used to stabilize the electrical impedance between power plane 18 and ground plane 16.

FIG. 4 depicts one embodiment of impedance network 12, wherein impedance network 12 includes an electrical resistance 28 connected in series with an electrical capacitance 30. Electrical resistance 28 may be, for example, a surface mount resistor. Similarly, electrical capacitance 30 may be, for example, a surface mount capacitor. A first via 32 connects power plane 18 to electrical resistance 28, and a second via 34 connects ground plane 16 to electrical capacitance 30. Vias 32 and 34 may be, for example, plated-through holes formed using various well known techniques.

During use of interconnect apparatus 10, the power supply provides a direct current (d.c.) electrical potential between power plane 18 and ground plane 16. Impedance networks 12 which ring the upper surface of interconnect apparatus 10 provide alternating current (ac.) termination of the structure including power plane 18, ground plane 16, and second dielectric layer 24 separating power plane 18 and ground plane 16. Electrical switching occurring within electronic devices connected between power plane 18 and ground plane 16 creates ac. waveforms within power plane 18 and ground plane 16. These ac. waveforms "see" an impedance value substantially equal to all of the electrical resistances 28 of impedance networks 12 in parallel. At the same time, electrical capacitances 30 prevent d.c. current from flowing between power plane 18 and ground plane 16 through impedance networks 12.

Figure 5:
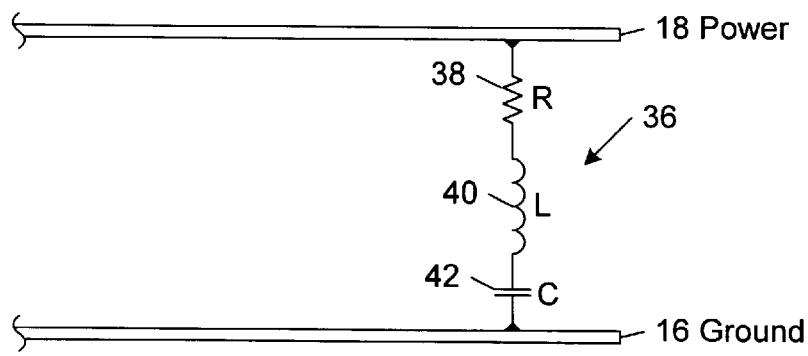
FIG. 5 is a circuit diagram showing an equivalent electrical network between the power and ground planes provided by the impedance network depicted in FIG. 4.

FIG. 5 is a circuit diagram showing an equivalent electrical network 36 between power plane 18 and ground plane 16 provided by the impedance network 12 depicted in FIG. 4. Electrical network 36 includes an electrical resistance 38, an electrical inductance 40, and an electrical capacitance 42. The value of resistance 38 includes the value of resistance 28, the electrical resistances of vias 32 and 34, and the equivalent series resistance (ESR) of capacitance 42. Inductance 40 includes the inductances of resistance 28, capacitance 30, via 32, and via 34. Capacitance 42 includes the value of capacitance 30.

As described above, impedance networks 12 are separated by a selected spacing distance s. Signals are conveyed within interconnect apparatus 10 (e.g., within a signal layer) and have an associated range of frequencies (i.e., a frequency range of interest). Spacing s between impedance networks 12 is preferably made equal to a fraction of the wavelength of the highest frequency in the frequency range of interest. Spacing N may be, for example, less than or equal to one tenth of the wavelength of the highest frequency in the frequency range of interest.

For example, signals conveyed within interconnect apparatus 10 may have a transition time (i.e., rise or fall time) of 1 nanosecond. In this case, the highest frequency in the frequency range of interest, "ƒm", may be the reciprocal of π times the transition time, or about 318 MHz. The wavelength of ƒm is the velocity divided by the frequency. If the dielectric layer separating power plane 18 and ground plane 16 has a relative dielectric constant of 4.7, the velocity is the speed of light "c" (about 3.0×10$^8$ m/sec) divided by the square root of the relative dielectric constant "i", or approximately 1.38×10$^8$ m/sec. The wavelength of ƒm is the velocity (about 1.38×10$^8$ m/sec) divided by the frequency (approximately 318 MHz), or about 43 cm. In this case, spacing s may be less than or equal to about 4.3 cm (approximately 1.7 in.). In terms of a mathematical equation, $$s \le \frac{c}{10 f_m \sqrt{\varepsilon_r}}$$

Figure 6:
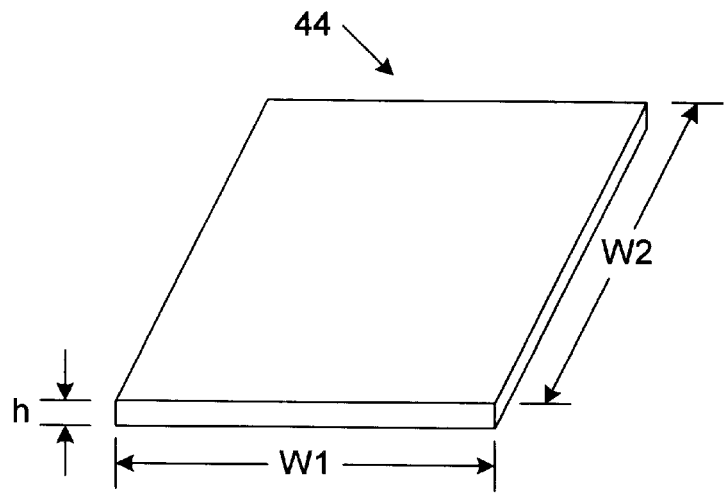
FIG. 6 is a perspective view of a rectangular structure including a pair of planar electrical conductors separated by a dielectric layer.
Figure 7:
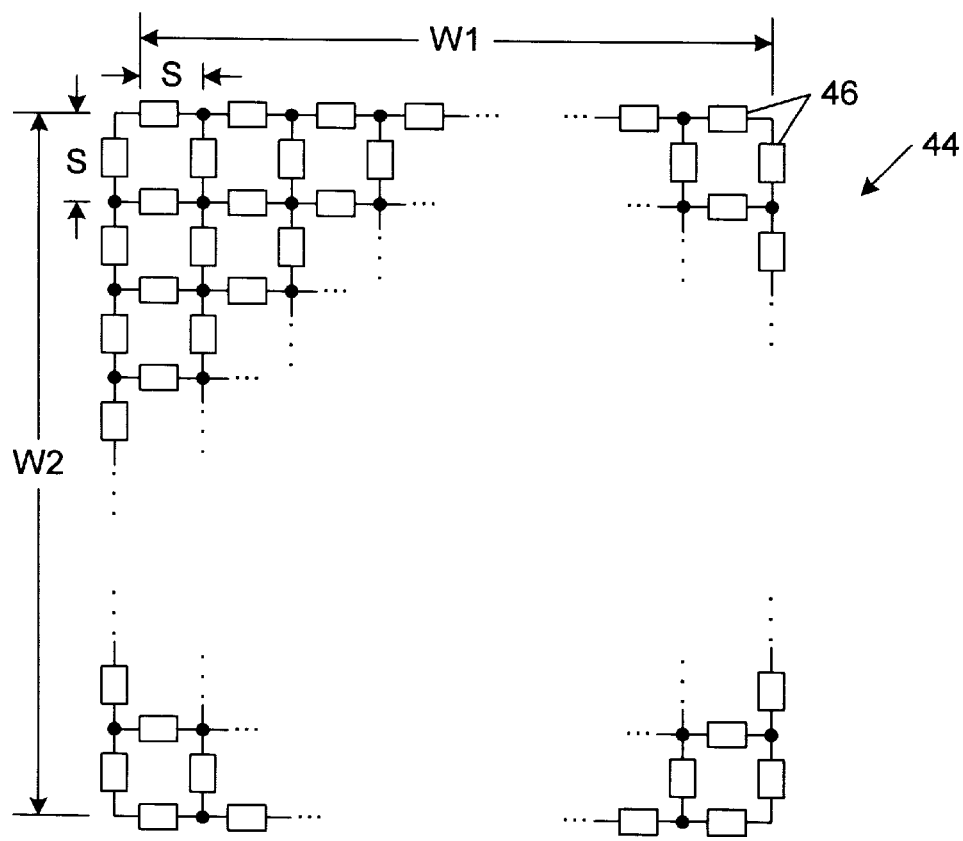
FIG. 7 is a block diagram illustrating how the structure of FIG. 6 is modeled as a two-dimensional network (i.e., grid) of ideal (i.e., lossless) transmission line segments.

FIG. 6 is a perspective view of a rectangular structure 44 including a pair of planar electrical conductors separated by a dielectric layer. The planar conductors have dimensions "w1" and "w2", and the dielectric layer has a thickness or height "h". As shown in FIG. 7, structure 44 is modeled as a two-dimensional network (i.e., grid) of ideal (i.e., lossless) transmission line segments 46. Two sets of parallel lines with equivalent spacings s are superimposed upon one another such that members of one set are perpendicular to members of the other set. Transmission line segments 46 are inserted between the intersections of these lines, and transmission line segments 46 are connected at the intersections. It is noted that while lossless transmission line segments 46 are described herein, "lossy" transmission line segments may be developed which account for resistive and skin losses in conductors and dielectric losses is dielectric layers.

The characteristics of ideal transmission lines are determined by two equations of two variables: the inductance "L" of the transmission line per unit length and the capacitance "C" of the transmission line per unit length. A first equation defines a characteristic impedance "$Z_O$" of the transmission line:

$$Z_o = \sqrt{\frac{L}{C}}$$

The second equation defines the propagation delay "$t_{pd}$" of the transmission line per unit length:

$$t_{pd} = \sqrt{LC}$$

Parameters for each transmission line segment 46 are determined on a "unit cell" basis. The static (i.e., low frequency) capacitance of each square s-by-s unit cell "Cu" is given by:

$$C_u = \varepsilon_o \varepsilon_r \left(\frac{s^2}{h}\right)$$

The propagation delay along an edge of the unit cell "$t_{pd\_u}$" is determined by s, the speed of light c, and the relative dielectric constant $\varepsilon_r$ of the dielectric layer separating the planar conductors:

$$t_{pd\_u} = \frac{s}{c}\sqrt{\varepsilon_r}$$

The values of $t_{pd\_u}$ and Cu are used to derive an approximate low frequency characteristic impedance "Zo_u" of each s-by-s square unit cell:

$$Z_{o\_u} = \frac{t_{pd\_u}}{C_u} = \left(\frac{s\sqrt{\varepsilon_r}}{c}\right)\left(\frac{h}{\varepsilon_o \varepsilon_r s^2}\right) = \frac{h}{c\varepsilon_o s\sqrt{\varepsilon_r}} = Z_{\infty}\left(\frac{h}{s\sqrt{\varepsilon_r}}\right)$$

where $Z_{OO}$ is the impedance of free space, 120π ohms.

Each square s-by-s unit cell is represented by four transmission line segments 46, one along each side of the unit cell. Each transmission line segment 46 has a characteristic impedance of 4·Zo_u. Transmission line segments 46 of adjacent unit cells are in parallel, resulting in equivalent characteristic impedances of 2·Zo_u. Thus transmission line segments 46 along borders between adjacent unit cells have characteristic impedances of 2·Zo_u, and transmission line segments 46 along outer edges of structure 44 have characteristic impedances of 4·Zo_u. All transmission line segments 46 have $t_{pd\_u}$ propagation delays.

When interconnect apparatus 10 is square, the values for electrical resistances 28 positioned along the edges of interconnect apparatus 10 may be selected by (i) computing the characteristic impedance of the structure including the planar conductors, (ii) determining spacing distance s, and (iii) multiplying the characteristic impedance of the structure by the ratio of the length of one side of the structure to spacing distance s. For example, assume interconnect apparatus 10 includes a pair of 10 in.×10 in. square planar conductors separated by a dielectric layer having a thickness or height h of 0.004 in. and a relative dielectric constant $\varepsilon_r$ of 4.7. Digital signals are conveyed having transition times of 1 nanosecond. As described above, the highest frequency in the frequency range of interest ƒm may be the reciprocal of a times the transition time, or 318 MHz. Spacing s is thus preferably less than or equal to 1.7 in. In this case, select spacing s of 1.0 in. The characteristic impedance "$Z_O$" of the structure including the planar conductors and the dielectric layer is calculated using:

$$Z_o = Z_{\infty}\left(\frac{h}{w\sqrt{\varepsilon_r}}\right) = (120\pi)\left(\frac{0.004}{10\sqrt{4.7}}\right) = 0.070\ \Omega$$

The ratio of the length of one side of the structure to spacing distance s is 10, thus each electrical resistance 28 should have a value of about 0.070Ω·10=0.70Ω.

When interconnect apparatus 10 is rectangular but not square, the values for electrical resistances 28 positioned along the edges of structure 44 may be selected by: (i) determining spacing distance s, and (ii) computing the characteristic impedance of each s-by-s unit cell. For example, assume structure 44 has dimensions of 8 in.×10 in., a dielectric layer having a thickness or height h of 0.031 in.

and a relative dielectric constant $\varepsilon_r$ of 4.7, and digital signals with transition times of 1 nanosecond are conveyed. As described above, the highest frequency in the frequency range of interest ƒm may be the reciprocal of π times the transition time, or 318 MHz. Spacing s is thus preferably less than or equal to 1.7 in. As before, select spacing s of 1.0 in. Each square s-by-s unit cell has a characteristic impedance "$Z_{O\_u}$" given by:

$$Z_{o\_u} = Z_{\infty}\left(\frac{h}{w\sqrt{\varepsilon_r}}\right) = (210\pi)\left(\frac{0.031}{1.0\sqrt{4.7}}\right) = 5.39\ \Omega$$

Each electrical resistance 28 should have a value of about 5.39Ω.

Figure 2:
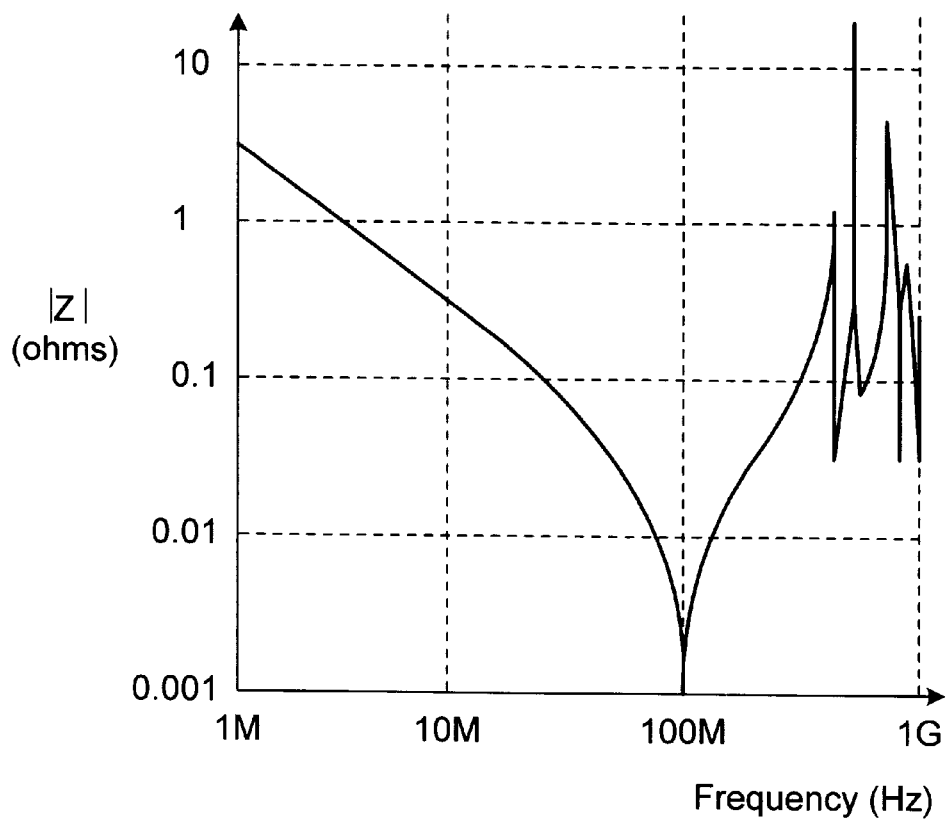
FIG. 2 is a graph of the magnitude of the simulated electrical impedance $|Z|$ ($\log_{10}$ scale) between the pair of rectangular conductive planes of FIG. 1 versus the frequency of a voltage ($\log_{10}$ scale) between the planes.

The value for each electrical capacitance 30, denoted C, is preferably determined using the following equation:

$$C > \frac{1}{2\pi \cdot R \cdot f_{res}}$$

where R is the value of electrical resistance 28 and $f_{res}$ is the lowest resonant frequency of the structure including the planar conductors separated by the dielectric layer. Resonant frequency $f_{res}$ may be determined experimentally or by computer simulation. In FIG. 2, $f_{res}$ is the frequency where the impedance is minimum, approximately 100 MHz.

Figure 8:
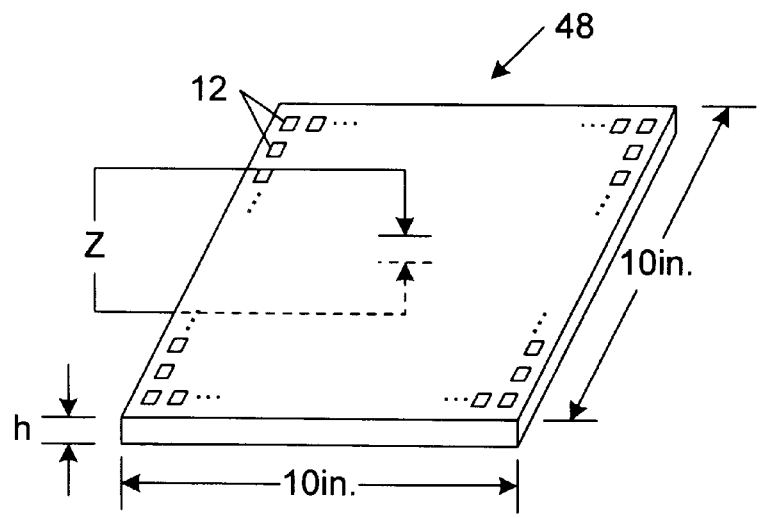
FIG. 8 is a perspective view of a structure including a pair of 10 in.×10 in. square conductive planes separated by a fiberglass-epoxy composite dielectric layer, wherein multiple impedance networks are dispersed within a region near the periphery of the upper surface of the structure and connected between the planes.

FIG. 8 is a perspective view of a structure 48 including a pair of 10 in.×10 in. square conductive planes separated by a fiberglass-epoxy composite dielectric layer. Each conductive plane is made of copper and is 0.0014 in. thick. The fiberglass-epoxy composite layer separating the planes has a dielectric constant of 4.0 and has a thickness or height h of 0.004 in. Multiple impedance networks 12 are dispersed about a region near the periphery of the upper surface of structure 48 as shown in FIG. 8 and separated by a spaced distance s of 1.0 in. Each impedance network 12 included an electrical resistance 28 in series with a capacitance 30 as described above. Each capacitance 30 was selected to be 1.0 microfarad.

The characteristic impedance "$Z_O$" of the structure is calculated using:

$$Z_o = Z_{\infty}\left(\frac{h}{w\sqrt{\varepsilon_r}}\right) = (120\pi)\left(\frac{0.004}{10\sqrt{4.0}}\right) = 0.075\ \Omega$$

The ratio of the length of one side of the structure to spacing distance s is 10, thus each electrical resistance 28 should have a value of about 0.075Ω·10=0.75Ω.

Each impedance network 12 was represented by an equivalent electrical network 36 including an electrical resistance 38 having a value of 0.75 ohms, an electrical inductance 40 having a value of 0.2 nanohenries, and an electrical capacitance 42 having a value of 1.0 microfarads. The value of resistance 38 is the sum of the resistance 28 and the electrical resistances of vias 32 and 34, inductance 40 is the electrical inductances of vias 32 and 34, and capacitance 42 is the selected value of capacitance 30.

Figure 9:
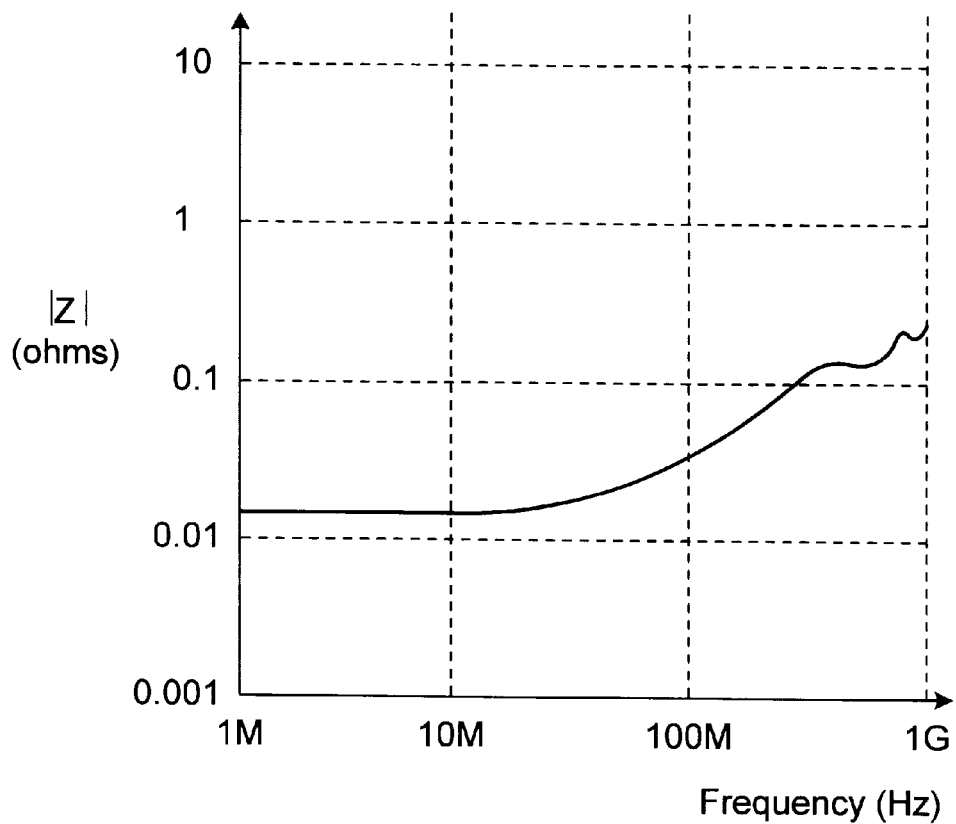
FIG. 9 is a graph of the logarithm of the magnitude of the simulated electrical impedance $|Z|$ ($\log_{10}$ scale) between the pair of conductive planes of the structure of FIG. 8 versus the frequency of a voltage ($\log_{10}$ scale) between the planes.

FIG. 9 is a graph of the magnitude of the simulated electrical impedance |Z| between the pair of conductive planes of structure 48 of FIG. 8 ($\log_{10}$ scale) versus the frequency of a voltage between the planes ($\log_{10}$ scale). The impedance value Z was computed by simulating the application of a 1 ampere constant current between the centers of the planes, varying the frequency of the current, and determining the magnitude of the steady state voltage between the centers of the rectangular planes. As shown in FIG. 9, the electrical impedance between the parallel conductive planes of FIG. 8 is nearly constant from 1 MHz to about 50 Mhz, and increases almost monotonically at frequencies above 50 MHz. The multiple electrical resonances of the conductive planes of FIG. 1 and evidenced at frequencies between 100 MHz and 1 GHz in FIG. 2 have been damped, resulting in the stabilizing of the impedance between the pair of conductive planes. As a result, the "edge terminated" parallel conductive planes of FIG. 8 would radiate a substantially smaller amount of EMI than the "unterminated" conductive planes of FIG. 1.

Figure 10:
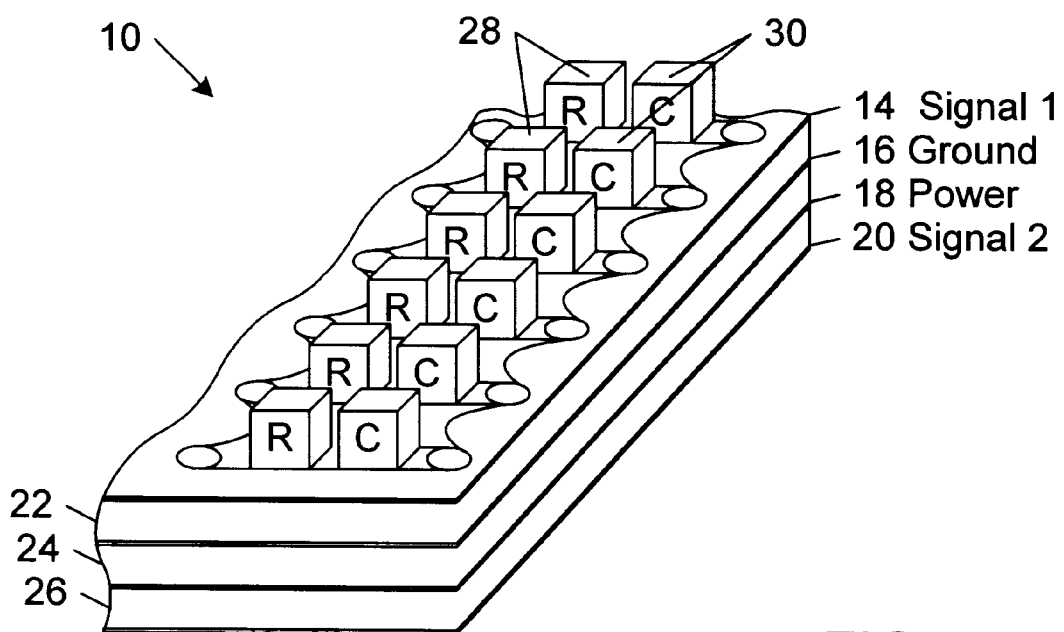
FIG. 10 is a perspective view of a portion of the interconnect apparatus of FIG. 3 wherein impedance networks are connected together to form a chain or "bar" of impedance networks.

FIG. 10 is a perspective view of a portion of interconnect apparatus 10 wherein impedance networks 12 are connected together to form a chain or "bar" of impedance networks 12. Each impedance network 12 is a spaced distance s from adjacent impedance networks 12. The bar of impedance networks 12 may extend along the entire length of an edge of the upper surface of interconnect apparatus 10. A bar of impedance networks 12 may extend across each of the four edges of the upper surface of a rectangular interconnect apparatus 10.

Figure 11:
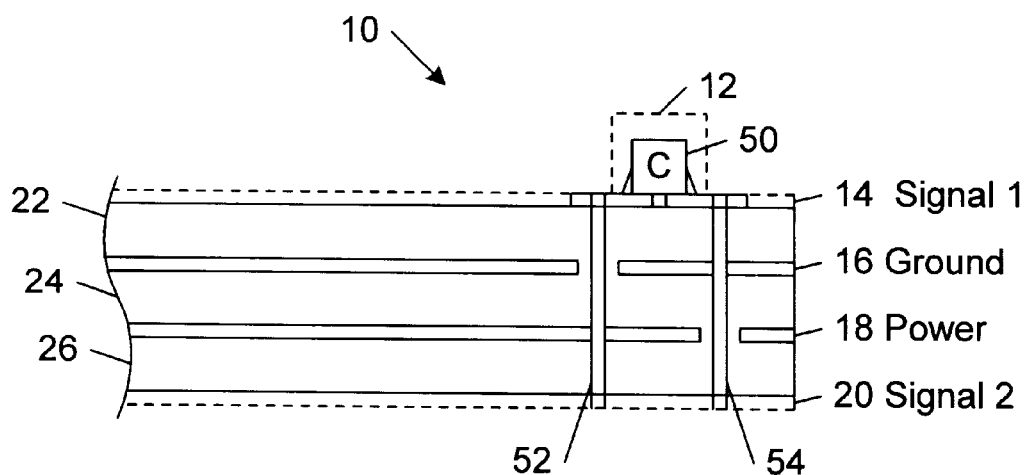
FIG. 11 is a cross sectional view of a portion of the interconnecting apparatus of FIG. 3 illustrating a second embodiment of the impedance networks, wherein each impedance network includes a capacitance, and wherein a resistance in series with the capacitance is the sum of the equivalent series resistance (ESR) of the capacitance and the resistances of the vias connecting the impedance network between the power and ground planes.

FIG. 11 is a cross sectional view of a portion interconnecting apparatus 10 illustrating a second embodiment of impedance networks 12. In the embodiment of FIG. 11, each impedance network 12 includes a capacitance 50. A first via 52 connects power plane 18 to a first terminal of capacitance 50, and a second via 54 connects ground plane 16 to a second terminal of capacitance 50. Vias 52 and 54 may be, for example, plated-through holes formed using various well known techniques.

An electrical resistance substantially equal to the value of resistance 28 is incorporated in series with capacitance 50. For example, capacitance 50 may be selected such that it has an equivalent series resistance (ESR) substantially equal to the value of resistance 28. Alternately, vias 52 and 54 may be formed such that the sum of their resistances is substantially equal to the value of resistance 28. The resistances of vias 52 and 54 may be increased, for example, by reducing their cross sectional areas or by forming them from a material having a higher resistivity.

Figure 12:
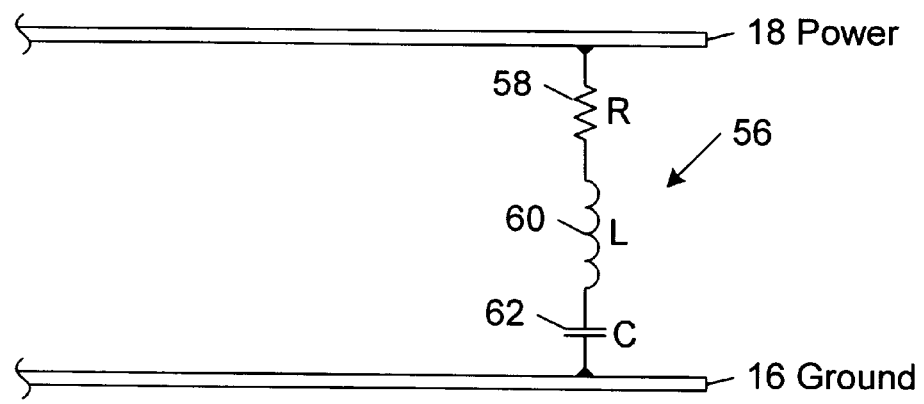
FIG. 12 is a circuit diagram showing an equivalent electrical network between the power and ground planes provided by the impedance network depicted in FIG. 11.

FIG. 12 is a circuit diagram showing an equivalent electrical network 56 between power plane 18 and ground plane 16 provided by the impedance network 12 depicted in FIG. 11. Electrical network 56 includes an electrical resistance 58, an electrical inductance 60, and an electrical capacitance 62. The value of resistance 58 includes the ESR of capacitance 62 and the electrical resistances of vias 52 and 54. Inductance 60 includes the inductances of capacitor 50, via 52, and via 54. Capacitance 62 includes the value of capacitance 50.

Figure 13:
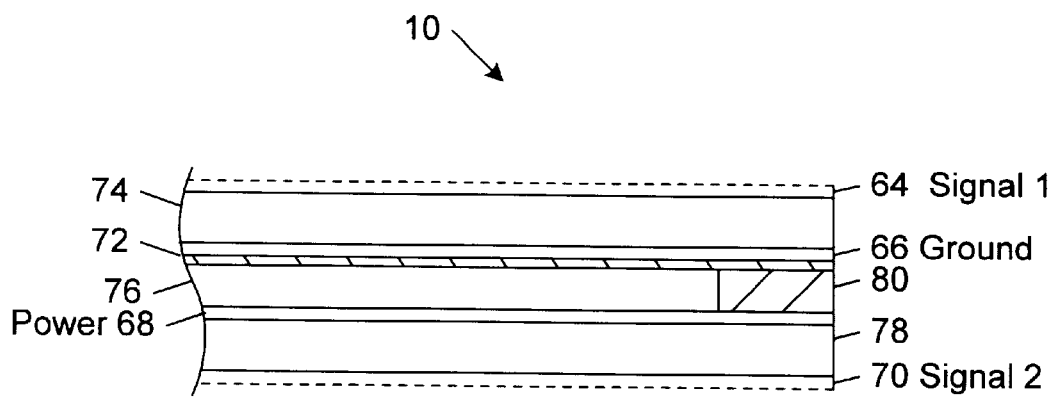
FIG. 13 is a cross sectional view of a portion the interconnecting apparatus of FIG. 3 illustrating an alternate method of forming an electrical resistance and capacitance in series between two conductive planes separated by a dielectric layer, wherein a resistive layer and an outer portion of the dielectric layer form a continuous (i.e., distributed) impedance network between regions of the conductive planes near peripheries.

FIG. 13 is a cross sectional view of a portion of interconnecting apparatus 10 illustrating an alternate method of forming an electrical resistance and capacitance in series between two conductive planes separated by a dielectric layer. The conductive planes may be, for example, connected to different d.c. potentials as are a power plane and a ground plane. In the embodiment of FIG. 13, the multiple impedance networks 12 of FIGS. 3–4 are replaced by a continuous (i.e., distributed) impedance network formed between regions of the conductive planes near peripheries.

In the embodiment of FIG. 13, interconnecting apparatus 10 includes four electrically conductive planes: a first signal plane 64, a ground plane 66, a power plane 68, and a second signal plane 70. A planar electrically resistive layer 72 is between ground plane 66 and power plane 68 and in contact with ground plane 66. First signal plane 64 and ground plane 66 are separated by a first dielectric layer 74. Resistive layer 72 and power plane 68 are separated by a second dielectric layer 76. Power plane 68 and second signal plane 70 are separated by a third dielectric layer 78.

A portion 80 around a region near the periphery of planar dielectric layer 76 has a higher relative dielectric constant than Me relative dielectric constant of the remainder of dielectric layer 76. Portion 80 of dielectric layer 76 provides an electrical capacitance between power plane 68 and resistive layer 72. Resistive layer 72 provides a resistance between dielectric layer 76 and ground plane 66. The combination of portion 80 of dielectric layer 76 and resistive layer 72 between power plane 68 and ground plane 66 forms an electrical capacitance and an electrical resistance in series between power plane 68 and ground plane 66. The distributed impedance afforded by the series combination of the electrical capacitance and an electrical resistance is used to stabilize the electrical impedance between power plane 68 and ground plane 66.

Resistive layer 72 may include, for example, electrically conductive particulates (e.g., silver, copper, or nickel) suspended in a nonconductive binder (e.g., epoxy resin, urethane, or polyester). The resistivity of the particulate-binder combination may be varied by changing the number of conductive particulates per unit volume of the particulate-binder combination. Increasing the number of suspended conductive particulates per unit volume of the particulate-binder combination decreases the resistivity of the particulate-binder combination. Deceasing the number of suspended conductive particulates per unit volume of the particulate-binder combination increases the resistivity of the particulate-binder combination.

Resistive layer 72 is formed such that the electrical resistance between portion 80 of dielectric layer 76 and ground plane 66 along each edge of interconnect apparatus 10 is substantially equal to the characteristic impedance between power plane 68 and ground plane 66. For example, assume a structure including a pair of 10 in.×10 in. square planar conductors separated by a dielectric layer having a relative dielectric constant of 4.7 and a thickness or height h of 0.004 in. The characteristic impedance "$Z_O$" of the structure is calculated as:

$$Z_o = Z_\infty \left( \frac{h}{w\sqrt{\varepsilon_r}} \right) = (120\pi)\left( \frac{0.004}{10\sqrt{4.7}} \right) = 0.070 \ \Omega$$

Accordingly, the electrical resistance between portion 80 of dielectric layer 76 and ground plane 66 along each edge of the structure is substantially equal to 0.070Ω.

It is noted that planar resistive layer 72 may alternately be positioned between second dielectric layer 76 and power plane 68, and in contact with power plane 68. In yet another embodiment, a first and second resistive layers may be positioned between ground plane 66 and power plane 68. The first resistive layer may be located between second dielectric layer 76 and ground plane 66, and in contact with ground plane 66. The second resistive may be located between second dielectric layer 76 and power plane 68, and in contact with power plane 68.

The dielectric constant of portion 80 of dielectric layer 76 may be increased by suspending particulates of a substance having a relatively high dielectric constant (e.g., titanium dioxide or barium titanate) within a dielectric binder material (e.g., epoxy resin, polytetrafluoroethylene, or polystyrene). The dielectric constant of the particulate-binder combination may be varied by changing the number of particulates per unit volume of the particulate-binder combination. Increasing the number of suspended particulates per unit volume of the particulate-binder combination increases the dielectric constant of the particulate-binder combination. Decreasing the number of suspended particulates per unit volume of the particulate-binder combination decreases the dielectric constant of the particulate-binder combination.

Portion 80 of dielectric layer 76 is preferably formed such that the capacitance per unit length $C_l$ provided by portion 80 between power plane 68 and ground plane 66 along each outer edge of rectangular interconnect apparatus 10 is given by:

$$C_l > \frac{1}{2\pi \cdot R_l \cdot f_{res}}$$

where $R_l$ the resistance per unit length provided by resistive layer 72 and $f_{res}$ is the lowest resonant frequency of the structure including power plane 68, ground plane 66, and dielectric layer 76.

Figure 14:
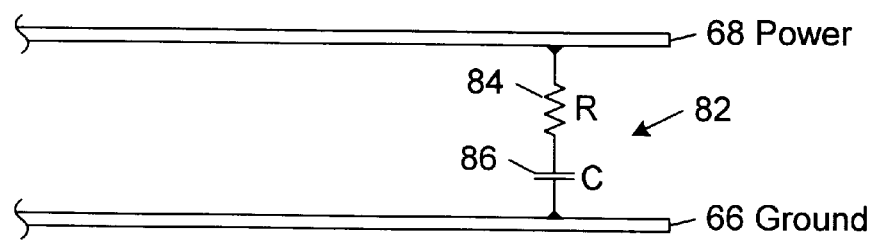
FIG. 14 is a circuit diagram showing an equivalent electrical network between the two conductive planes provided by the resistive layer and the outer portion of the dielectric layer as depicted in FIG. 13.

FIG. 14 is a circuit diagram showing an equivalent electrical network 82 between power plane 68 and ground plane 66 provided by portion 80 of dielectric layer 76 and resistive layer 72 as depicted in FIG. 13. Electrical network 82 includes an electrical resistance 84 and an electrical capacitance 86. The value of resistance 84 includes the resistance of resistive layer 72 offered between portion 80 of dielectric layer 76 and ground plane 66. Capacitance 86 includes the value of the capacitance offered by portion 80 of dielectric layer 76. The value and effects of any inductance in series with resistance 84 and capacitance 86 are believed negligible in the embodiment of FIG. 13.

Figure 15:
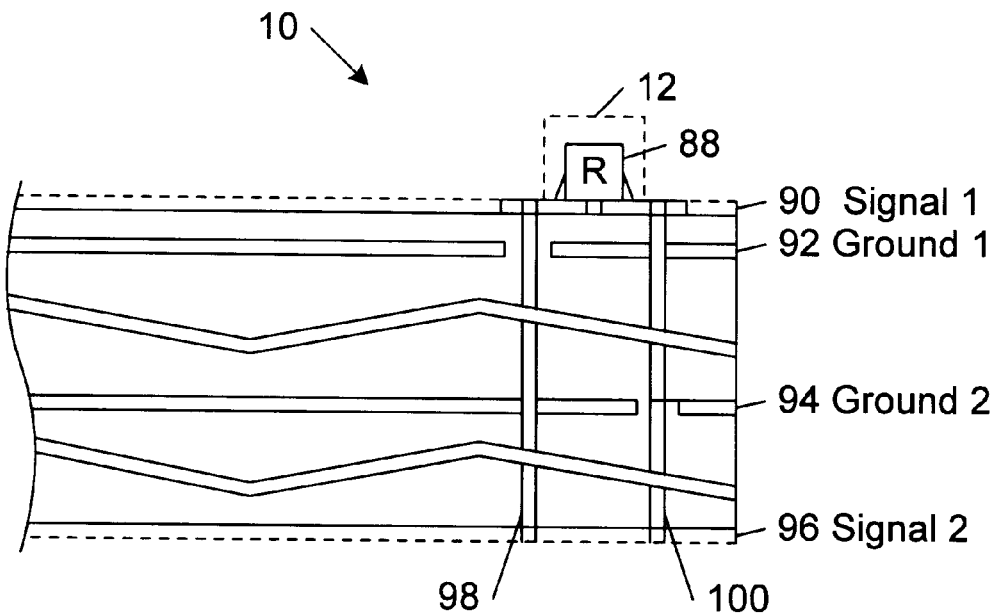
FIG. 15 is a cross sectional view of a portion the interconnecting apparatus of FIG. 3 illustrating another alternate embodiment of the impedance networks, wherein each impedance network includes only an electrical resistance connected between two ground planes.

FIG. 15 is a cross sectional view of a portion interconnecting apparatus 10 illustrating another alternate embodiment of impedance networks 12. In the embodiment of FIG. 15, impedance networks 12 are connected between a pair of planar conductors separated by at least one dielectric layer and connected to the same d.c. potential. The planar conductors may be, for example, two different ground planes. Each impedance network 12 includes an electrical resistance 88. The value of resistance 88 is determined in the same manner as described above for resistance 28. In the embodiment of FIG. 15, interconnecting apparatus 10 includes four electrically conductive planes: a first signal plane 90, a first ground plane 92, a second ground plane 94, and a second signal plane 96. A first via 98 connects second ground plane 94 to a first terminal of resistance 88, and a second via 100 connects first ground plane 92 to a second terminal of resistance 88. Vias 98 and 100 may be, for example, plated-through holes formed using various well known techniques.

Figure 16:
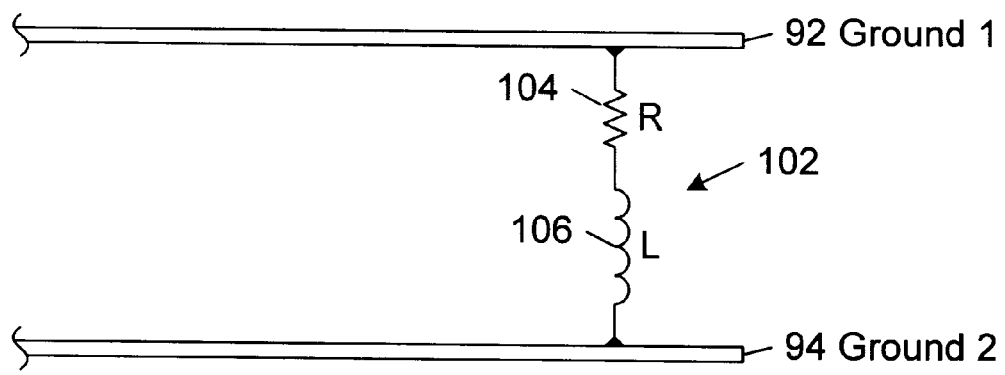
FIG. 16 is a circuit diagram showing an equivalent electrical network between the two ground planes provided by the impedance network depicted in FIG. 15.

FIG. 16 is a circuit diagram showing an equivalent electrical network 102 between first ground plane 92 and second ground plane 94 provided by the impedance network 12 depicted in FIG. 15. Electrical network 102 includes an electrical resistance 104 and an electrical inductance 106. The value of resistance 104 is substantially the sum of resistance 88 and the electrical resistances of vias 98 and 100. Inductance 106 is substantially the electrical inductances of vias 98 and 100.

Figure 17:
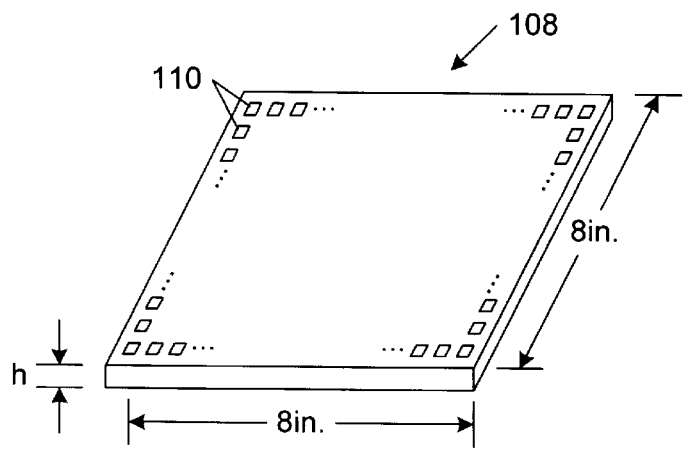
FIG. 17 is a perspective view of a structure including a pair of 8 in.×8 in. square conductive plates separated by a dielectric layer, wherein multiple impedance networks are dispersed within a region near the periphery of the structure and connected between the plates.
Figure 18:
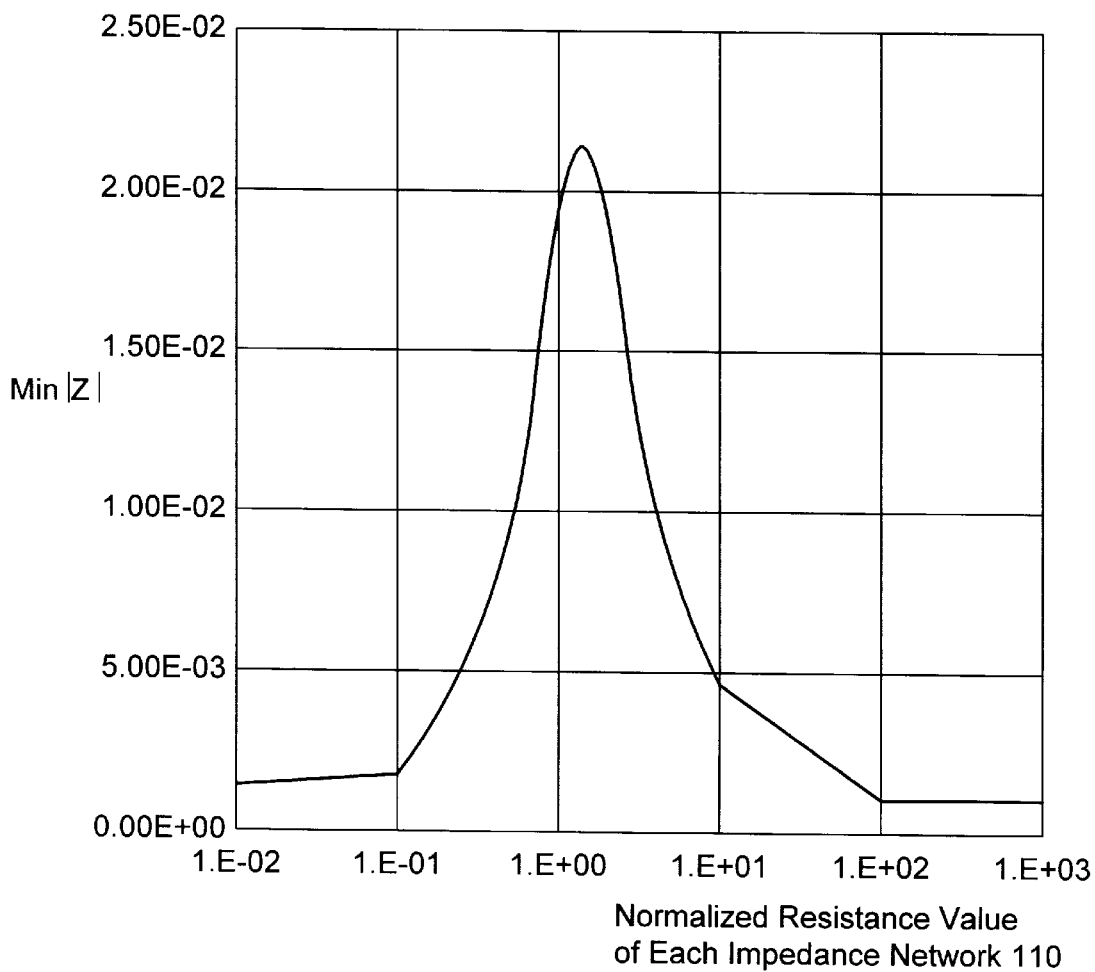

FIGS. 17 and 18 will now be used to illustrate the simulated effects of varying the resistance values of impedance networks dispersed about the periphery of a rectangular structure, including two parallel conductive plates separated by a dielectric layer, on the electrical impedance of the structure. FIG. 17 is a perspective view of a structure 108 similar to structure 48 of FIG. 8. Structure 108 includes a pair of 8 in.×8 in. square conductive plates separated by a dielectric layer (e.g., fiberglass-epoxy composite). Each conductive plate is made of copper and is 0.0014 in. thick. The dielectric layer separating the planes has a relative dielectric constant of 4.7 and a thickness or height h of 0.002 in. Multiple impedance networks 110 are connected between the plates about a region near a periphery of structure 108 as shown in FIG. 17. Adjacent impedance networks 110 are separated by a spaced distance s of 1.0 in.

For simplicity, each impedance network 110 included only an electrical resistance. The characteristic impedance "$Z_O$" of the structure is calculated as described above using:

$$Z_o = Z_{\infty}\left(\frac{h}{w\sqrt{\varepsilon_r}}\right) = (120\pi)\left(\frac{0.002}{8\sqrt{4.7}}\right) = 0.0435 \ \Omega$$

The ratio of the length of the sides of the structure to spacing distance s is 8, thus a nominal value of the electrical resistance of each impedance network 110 was selected to be about 0.0435Ω·8=0.348Ω.

Structure 108 was modeled as a two-dimensional network (i.e., grid) of transmission line segments as described above. The grid included two orthogonal sets of parallel lines with spacings s superimposed upon one another. The two orthogonal sets of parallel lines intersected at nodes, and transmission line segments were connected between the nodes along the parallel lines. Each square s-by-s unit cell included four transmission line segments, one along each side of the unit cell. Transmission line segments in parallel were replaced by a single transmission line segment having half the characteristic impedance of the parallel segments. As a result, transmission line segments along outer edges of structure 108 had characteristic impedances twice those of transmission line segments between adjacent unit cells. The resulting grid had 81 nodes connected by transmission line segments.

The electrical impedances of the all 81 grid nodes of the structure 108 model were simulated over a frequency range from 10 MHz to 1,000 MHz (i.e., 1 GHz). Between each set of simulations, the value of the electrical resistance of each impedance network 110 was varied. A norm value the electrical resistance of each impedance network 110 was calculated by dividing the actual resistance value by the nominal value. The normalized value of the electrical resistance of each impedance network 110 was varied over the range between 0.01 and 1,000.

In order to judge the effect of varying the impedance values of impedance networks 110 upon the electrical impedance of structure 108, a "Min" value of the magnitude of the impedance of structure 108 (i.e., Min |Z|) was computed. First, at each simulation frequency, the lowest value of the magnitudes of the impedances of the 81 grid nodes of the structure 108 model was determined. Second, the lowest impedance magnitude value over the entire range of simulation frequencies (i.e., Min |Z|) was determined. The "Min" designation refers to the two-step minimum finding process. The Min |Z| values were determined for each different resistance value of impedance networks 110.

FIG. 18 is a graph of the Min |Z| values versus the normalized resistance value of each impedance network 110 ($\log_{10}$ scale). Higher Min |Z| values evidence the lack of series resonance "dips" in electrical impedance, thus higher Min |Z| values are believed characteristic of a more stable impedance of structure 108. FIG. 18 shows that impedance networks 110 are effective in stabilizing the impedance of structure 108 over a wide range of normalized resistance values. Specifically, impedance networks 110 having normalized resistance values ranging from about 0.1 to approximately 100 are effective in stabilizing the impedance of structure 108. While impedance networks 110 having normalized resistance values of about 1.0 have the greatest stabilizing effect, normalized resistance values ranging from about 0.2 to approximately 10 are highly effective in stabilizing the impedance of structure 108.

A graph of "Max |Z|" values as a function of the normalized resistance of each impedance network 110 (not shown) was also prepared. The highest value of the magnitudes of the impedances of the 81 grid nodes was determined at each simulation frequency, then the highest impedance magnitude value over the entire range of simulation frequencies (i.e., Max |Z|) was determined. Lower Max |Z| values evidence the lack of parallel resonance "peaks" in electrical impedance, thus lower Max |Z| values are believed characteristic of a more stable impedance of structure 108. The Max |Z| graph also supported the above conclusions regarding the ability of impedance networks 110 to stabilize the impedance of structure 108 over a wide range of normalized resistance values.

A general method for determining electrical resistance values of, and locations for, impedance networks to be dispersed along a periphery of a structure includes selecting a spacing distance s and forming a grid using spacing distance s. Parallel lines of the grid are separated by spacing distance s, and the grid is sized such that it completely covers the structure when overlayed upon the structure. Outer edges of the grid may extend beyond the periphery of the structure (e.g., in the case of a non-rectangular structure). The characteristic impedance of the structure may then be estimated as described above using at least one physical dimension of the grid. The electrical resistance values of the impedance networks may be computed as described above based upon the estimated characteristic impedance of the structure.

Figure 19:
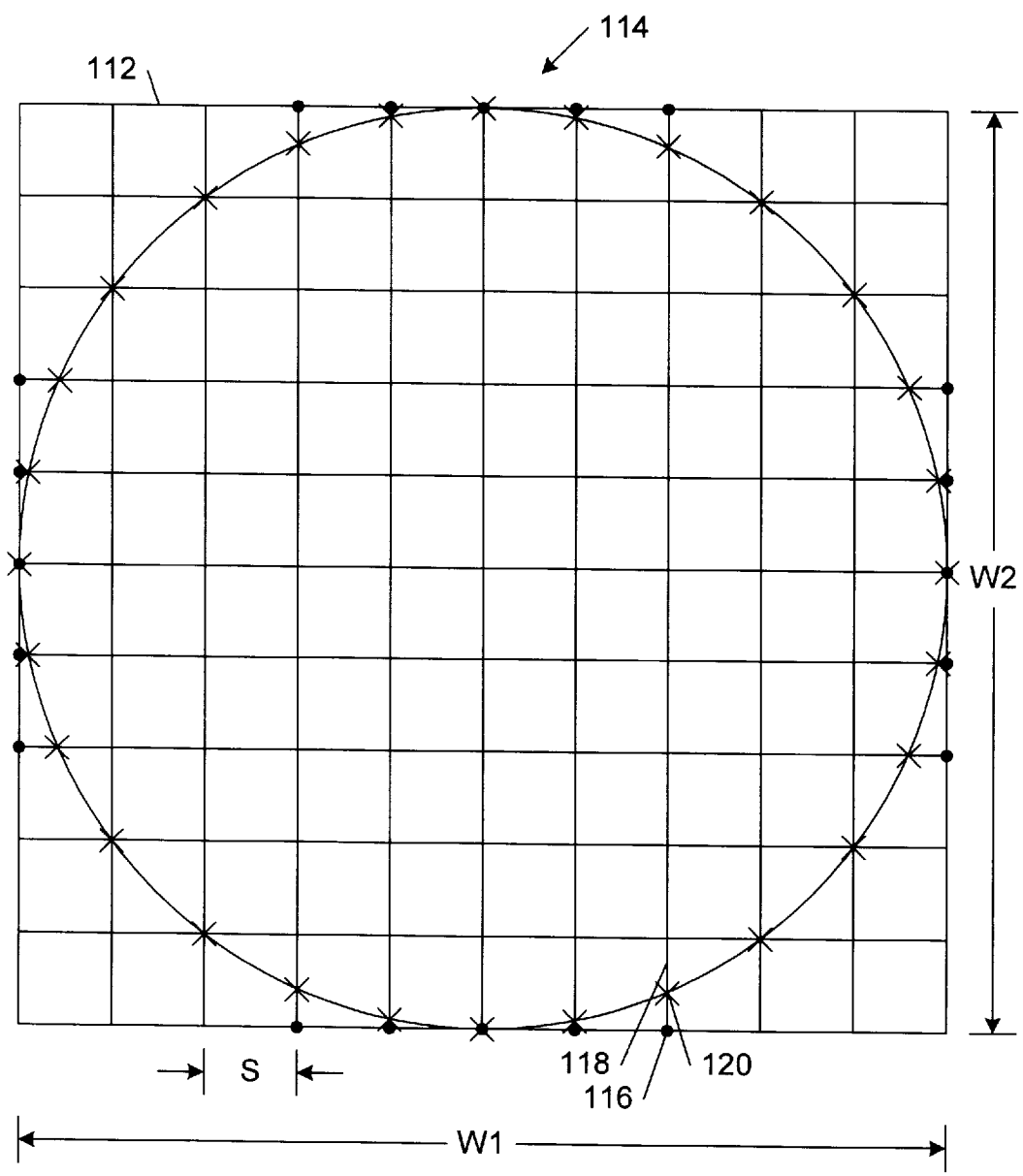
FIG. 19 is a top plan view of a rectangular grid overlying and covering an exemplary non-rectangular structure, wherein the structure includes two circular conductive plates arranged in parallel and separated by a dielectric layer, and wherein the grid is used to estimate the characteristic impedance of the structure.

FIG. 19 will now be used to illustrate the general method. FIG. 19 is a top plan view of a grid 112 overlayed upon and covering an exemplary non-rectangular structure 114. Structure 114 includes two circular conductive plates arranged in parallel and separated by a dielectric layer. The two circular conductive plates may, for example, have diameters of 10 in., and the dielectric layer may have a thickness or height h of 0.002 in. and a relative dielectric constant of 4.7.

Signals conveyed within structure 144 may have transition times of 1 nanosecond, leading to a highest frequency $fm$ in a frequency range of interest of about 318 MHz. As described above, spacing distance s may be selected according to:

$$s \leq \frac{c}{10 f_m \sqrt{\varepsilon_r}}$$

where c is the speed of light, $fm$ is a maximum frequency of a frequency range of interest, and s is the relative dielectric constant of the dielectric layer. A highest frequency $fm$ of 318 MHz and a relative dielectric constant of 4.7 leads to maximum spacings s of about 4.3 cm (approximately 1.7 in.). Spacings s may be selected to be, for example, 1.0 inch.

The grid may then be generated using spacing distance s. The grid includes two orthogonal sets of parallel lines superimposed upon one another. The parallel lines within each set are separated by spacing distance s, and the grid is dimensioned such that it completely covers the structure when overlayed upon the structure. The grid may be generated by selecting orthogonal first and second dimensions of the structure. The first and second dimensions are preferably selected such that the product of the first and second dimensions is minimized. Corresponding first and second dimensions of the grid may then be sized such that they are greater than or equal to the respective first and second dimensions of the structure. As the parallel lines of the grid are separated by spacing distance s, the first and second dimensions of the grid are integer multiples of spacing distance s.

In FIG. 19, dimensions w1 and w2 of grid 112 may be selected to be 10 in., the same as the diameters of the conductive circular plates of structure 114. As shown in FIG. 19, grid 112 may be overlayed upon structure 114 such that it completely covers structure 114. It is noted that other values of spacings S may require that dimensions w1 and w2 of grid 112 exceed the corresponding dimensions of structure 114 in order to allow grid 112 to completely cover structure 114 when overlayed upon structure 114. In general, it is desirable that the dimensions of grid 112 be the smallest possible which allow grid 112 to completely cover structure 114 when overlayed upon structure 114. In this case, the product of the orthogonal dimensions w1 and w2 of grid 112 will be minimized.

The characteristic impedance $Z_O$ of structure 114 may be estimated as described above using the equation:

$$Z_o = Z_{oo} \left( \frac{h}{w \sqrt{\varepsilon_r}} \right)$$

As grid 112 is square, w is made equal to dimension w1 (or w2) of grid 112 (i.e., 10 in.). The resulting estimated characteristic impedance $Z_O$ of structure 114 is:

$$Z_o = Z_{oo} \left( \frac{h}{w \sqrt{\varepsilon_r}} \right) = (120\pi) \left( \frac{0.002}{10 \sqrt{4.7}} \right) = 0.0348 \, \Omega$$

The ratio of w to spacing distance s is 10, thus a nominal value of the electrical resistance of each impedance network may be computed as $Z_O \cdot (w/s) = 0.0348\Omega \cdot 10 = 0.0348\Omega$.

It is noted that when the grid is not square, the value of w in the equation for characteristic impedance $Z_O$ above may be made equal to spacing distance s, and the resultant estimated characteristic impedance $Z_O$ may be used as the nominal value of the electrical resistance of each impedance network.

The locations of the impedance networks to be dispersed about the periphery of structure 114 may be determined as shown in FIG. 19. Nodes nearest the periphery of structure 114, designated by "●" symbols in FIG. 19, are first selected as potential locations of the impedance network Potential locations not falling along the periphery of structure 114 are moved to an adjacent portion of the periphery of structure 114. The resulting locations of the impedance networks are designated by the "x" symbols in FIG. 19. The potential locations are preferably moved to adjacent portions of the periphery such that the distances between a given location and its nearest neighbors are substantially equal. In FIG. 19, this is accomplished by moving the potential locations along lines of grid 122 to adjacent portions of the periphery of structure 114. For example, a potential location at node 116 is moved along line 118 of grid 122 to location 120 along the periphery of structure 114. The above example results in 28 impedance networks having resistance values of 0.348Ω and dispersed about the periphery of structure 144 as shown in FIG. 19. The impedance networks are separated by an average distance of about 1.22 in.

Again, exemplary structure 114 in FIG. 19 is non-rectangular. It is noted that the general method described above may be used for determining electrical resistance values of, and locations for, impedance networks to be dispersed along a periphery of any structure including a pair of parallel planar conductors separated by a dielectric layer, whether the planar conductors be rectangular or non-rectangular.

Figure 20:
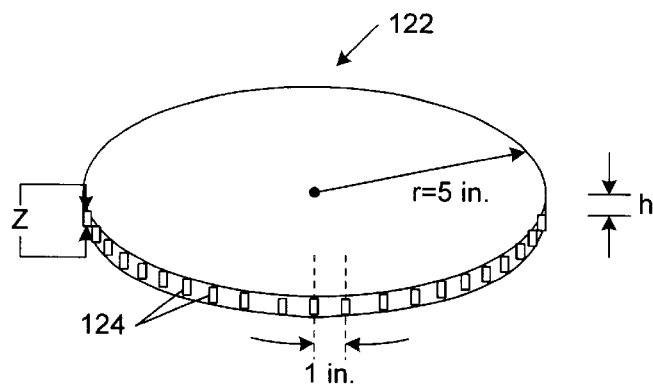
FIG. 20 is a perspective view of a structure including two circular conductive plates arranged in parallel and separated by a dielectric layer.
Figure 21:
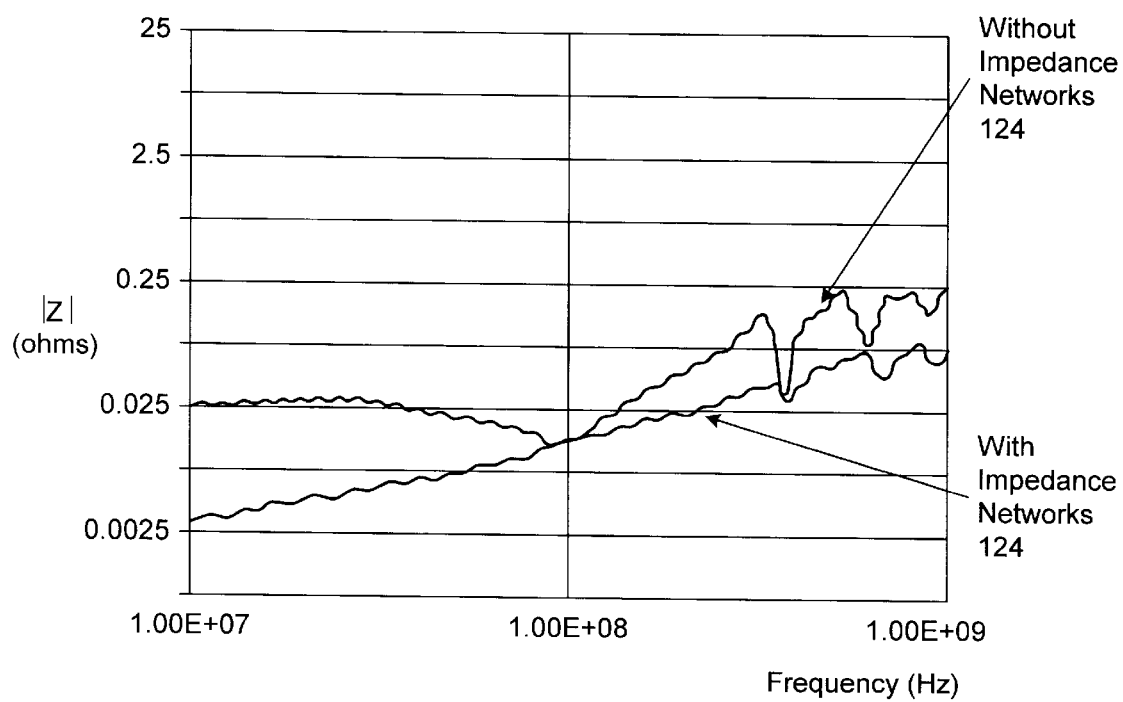

FIGS. 20 and 21 will now be used to illustrate how tolerant the edge termination method is to resistance values and placements of impedance networks about the periphery of a structure. FIG. 20 is a perspective view of structure 122 including two circular conductive plates arranged in parallel and separated by a dielectric layer. The two circular conductive plates have diameters of 10 in., and the dielectric layer has a thickness or height h of 0.002 in. and a relative dielectric constant of 4.7.

Rather than the 28 impedance networks having resistance values of 0.348Ω, 31 impedance networks having resistance values of 1.0Ω were placed at about 1.0 in. intervals around the periphery of structure 122. This change represents about an 18 percent decrease in average spacing and a 187 percent increase in electrical resistance (i.e., a normalized resistance value of 2.87). Electrical impedance measurements were made: (i) between the plates at a location along the periphery of structure 122 at a location corresponding to an impedance network, and (ii) both with and without impedance networks 124.

FIG. 21 is a graph of the magnitude of the measured impedance |Z| between the pair of circular conductive plates of structure 122 ($\log_{10}$ scale) versus the measurement frequency ($\log_{10}$ scale) both with and without impedance networks 124. As shown in FIG. 21, the electrical impedance of the "unterminated" structure 122 without impedance networks 124 varies greatly at frequencies above about 50 MHz. The parallel conductive plates exhibit multiple electrical resonances at frequencies between about 300 MHz and 1 GHz, resulting in alternating high and low impedance values. On the other hand, the electrical impedance of the "edge terminated" structure 122 with impedance networks 124 rises monotonically from 10 MHz to about 500 Mhz, and the multiple electrical resonances present without impedance networks 124 between about 300 MHz and 1 GHz are damped considerably. The impedance of structure 122 is thus stabilized significantly by the additions of impedance networks 124. It is believed the edge terminated structure 122 with impedance networks 124 would radiate a substantially smaller amount of EMI than the unterminated structure 122 without impedance networks 124.

Figure 22:
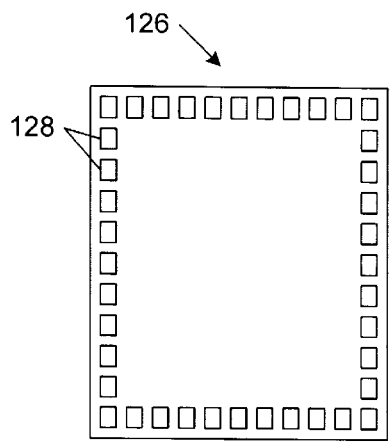
FIG. 22 is a top plan view of a structure including a pair of 10 in.×10 in. square conductive plates separated by a dielectric layer, wherein multiple impedance networks are connected between the plates at 1.0 in. spacings about a periphery of the structure.
Figure 23:
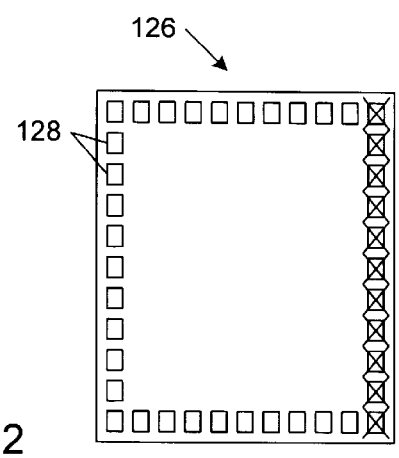
FIG. 23 is a top plan view of the structure of FIG. 22 wherein the impedance networks have been removed from one side of the square structure.
Figure 24:
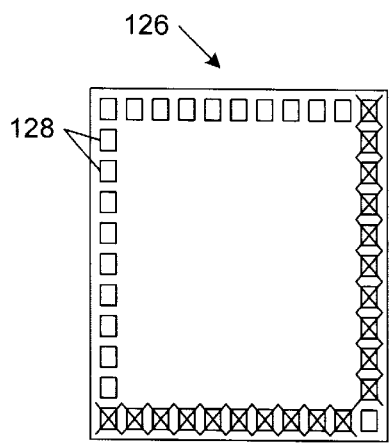
FIG. 24 is a top plan view of the structure of FIG. 22 wherein the impedance networks have been removed from two sides of the square structure.
Figure 25:
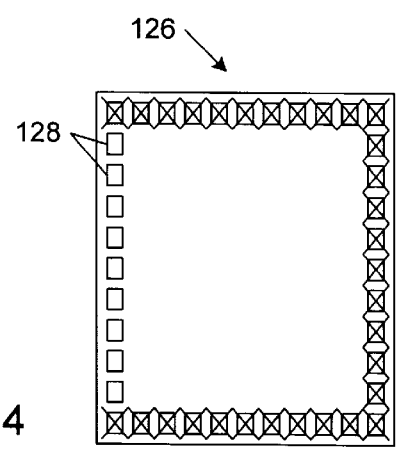
FIG. 25 is a top plan view of the structure of FIG. 22 wherein the impedance networks have been removed from three sides of the square structure.

FIGS. 22–26 will now be used to show how the simulated effects of eliminating impedance networks along one or more sides of a rectangular structure impacts the beneficial impedance-stabilizing effects of edge termination. FIG. 22 is a top plan view of a structure 126 including a pair of 10 in.×10 in. square conductive plates separated by a dielectric layer. Each conductive plate or sheet is made of copper and 0.0014 in. thick. The dielectric layer separating the planes has a relative dielectric constant of 4.7 and a thickness or height h of 0.002 in. Multiple impedance networks 128 are dispersed about a region near the periphery of structure 126 as shown in FIG. 22. The selected spacings s were 1.0 in. The electrical resistances of each impedance network 128 was computed as described above, resulting in a resistance value of 0.348Ω. FIGS. 23–25 show structure 126 with impedance networks 128 removed from one, two, and three sides respectively. In FIGS. 23–25, impedance networks 128 removed from structure 126 are marked with an "x" symbol.

Structure 126 was modeled as a two-dimensional network (i.e., grid) of transmission line segments as described above. The grid included two orthogonal sets of parallel lines with spacings s superimposed upon one another. The orthogonal sets of parallel lines intersected at nodes, and transmission line segments connected nodes along the parallel lines. The resulting grid had 121 nodes connected by transmission line segments.

The impedances of all the 121 grid nodes of the structure 126 model were simulated over a frequency range from 10 MHz to 1,000 MHz (i.e., 1 GHz). A first set of simulations measured the impedance of structure 126 with all impedance networks 128 intact (i.e., along all four sides of structure 126 as shown in FIG. 22). Between each successive set of simulations, impedance networks 128 were removed from a different side of structure 126 as shown in FIGS. 23–25.

A "Min" value of the magnitudes of the impedances of the nodes of structure 126 (i.e., Min |Z|) was computed as described above and used to judge the effects of eliminating impedance networks along one or more sides of structure 126 on the beneficial impedance-stabilizing effects of edge termination. First at each simulation frequency, the lowest value of the magnitudes of the impedances of the 121 grid nodes of the structure 126 model was determined. Second, the lowest impedance magnitude value over the entire range of simulation frequencies (i.e., Min |Z|) was determined.

Figure 26:
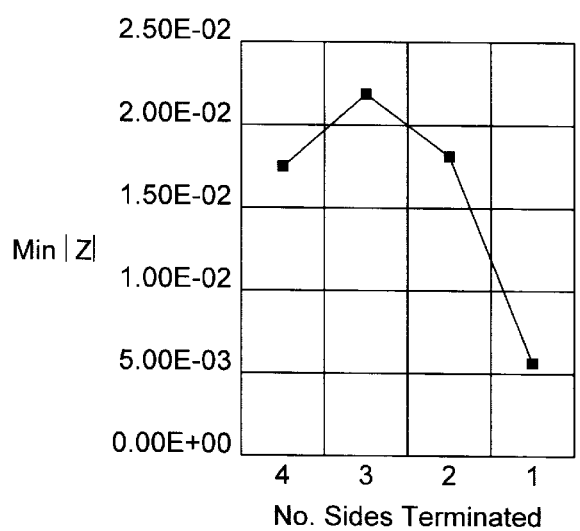

FIG. 26 is a graph of the Min |Z| values versus the number of sides of structure 126 having impedance networks 128 (i.e., the number of "edge terminated" sides of structure 126). As described above, higher Min |Z| values evidence the lack of series resonance "dips" in electrical impedance, thus higher Min |Z| values are believed characteristic of a more stable electrical impedance of structure 126. FIG. 26 shows that placing impedance networks 128 along 1 side of structure 126 provides a minimal amount of impedance stabilization, while placing impedance networks 128 along at least 2 sides of structure 126 provides a significant amount of impedance stabilization.

Figure 27:
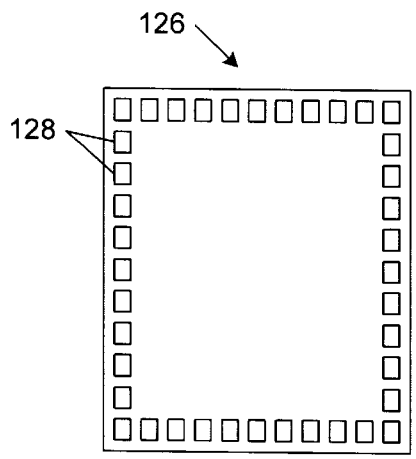
FIG. 27 is a top plan view of a structure including a pair of 10 in.×10 in. square conductive plates separated by a dielectric layer, wherein multiple impedance networks are connected between the plates at 1.0 in. spacings about a periphery of the structure, and wherein the square structure has four corner regions (i.e., "corners") wherein each "corner" includes an impedance network located at a corner of the structure and two impedance networks on either side.
Figure 28:
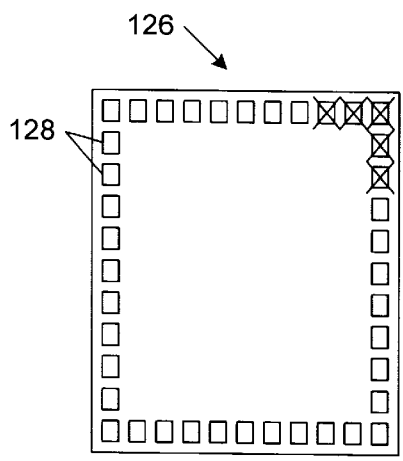
FIG. 28 is a top plan view of the structure of FIG. 27 wherein the impedance networks have been removed from one "corner" of the square structure.
Figure 29:
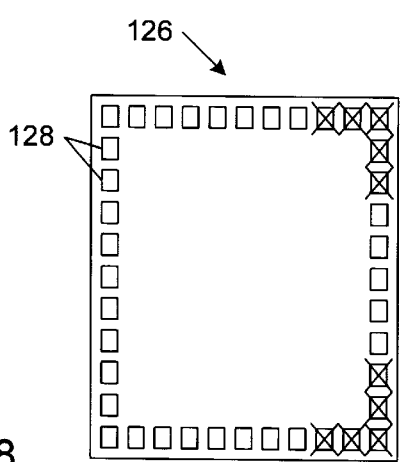
FIG. 29 is a top plan view of the structure of FIG. 27 wherein the impedance networks have been removed from two "corners" of the structure.
Figure 30:
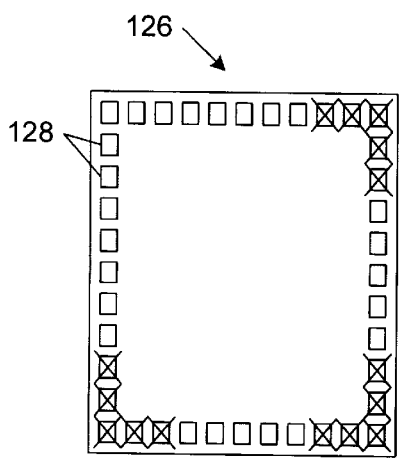
FIG. 30 is a top plan view of the structure of FIG. 27 wherein the impedance networks have been removed from three "corners" of the structure.
Figure 31:
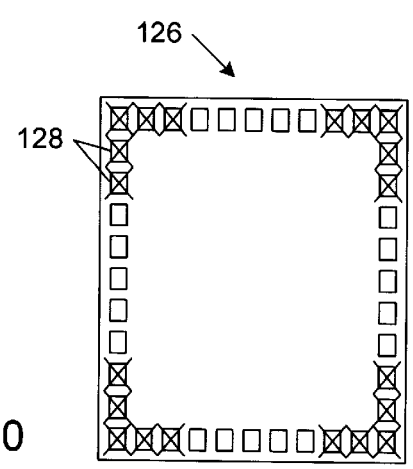
FIG. 31 is a top plan view of the structure of FIG. 27 wherein the impedance networks have been removed from all four "corners" of the structure.

FIGS. 27–32 will now be used to show the simulated effects of eliminating impedance networks along one or more corners of rectangular structure 126 on the beneficial impedance-stabilizing effects of edge termination. FIG. 27 is a top plan view of structure 126 having multiple impedance networks 128 dispersed about a region near the periphery of the upper surface as described above. Rectangular structure 126 has four corner regions or "corners", wherein each "corner" includes an impedance network 128 located at a corner of structure 126 and two impedance networks 128 on either side. FIGS. 28–31 show structure 126 with impedance networks 128 removed from one, two, three, and four "corners" respectively. In FIGS. 28–31, impedance networks 128 removed from structure 126 are marked with an "x" symbol.

Structure 126 was modeled as a two-dimensional grid with 1.0 in. spacings s and 121 nodes connected by transmission line segments as described above. The impedances of the all 121 grid nodes of the structure 126 model were simulated over a frequency range from 10 MHz to 1,000 MHz (i.e., 1 GHz). A first set of simulations measured the impedance of structure 126 with all impedance networks 128 intact (i.e., in all four corners of structure 126 as shown in FIG. 27). Between each successive set of simulations, impedance networks 128 were removed from a different "corner" of structure 126 as shown in FIGS. 28–31.

A "Min" value of the magnitudes of the impedances of the nodes of structure 126 (i.e., Min |Z|) was computed as described above and used to judge the effects of eliminating impedance networks from "corners" of structure 126 on the beneficial impedance-stabilizing effects of edge termination.

Figure 32:
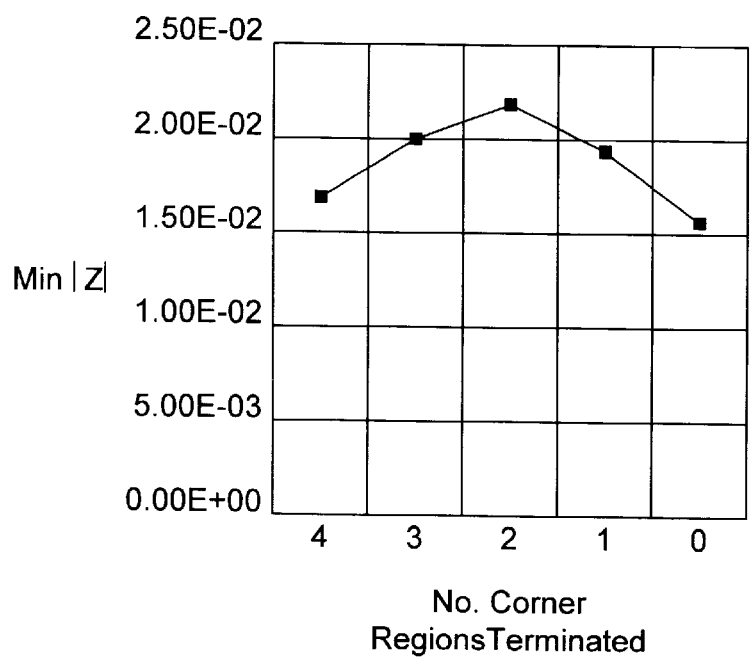

FIG. 32 is a graph of the Min |Z| values versus the number of "corners" of structure 126 having impedance networks 128 (i.e., the number of edge terminated "corners" of structure 126). FIG. 32 shows that removing impedance networks 128 from 1 to 3 "corners" of structure 126 does not have a negative impact on the impedance stabilization provided by impedance networks 128, while removing impedance networks 128 from all 4 "corners" of structure 126 has only a slight negative impact on the impedance stabilization.

Figure 33:
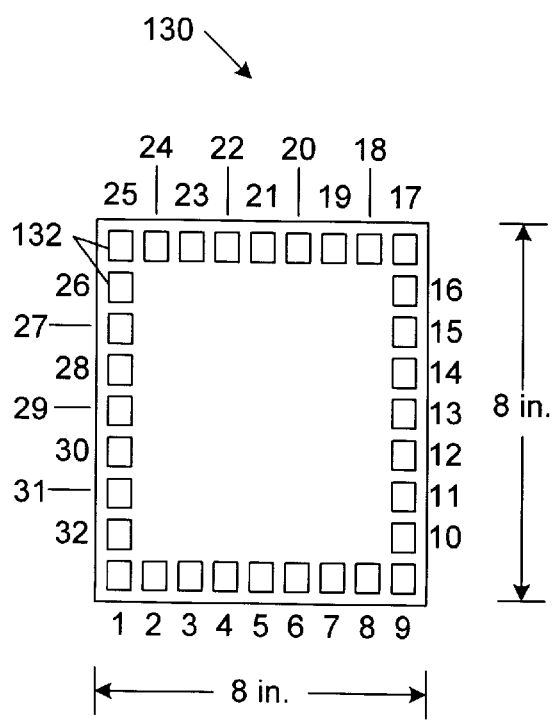
FIG. 33 is a top plan view of a structure including a pair of 8 in.×8 in. square conductive plates separated by a dielectric layer, wherein multiple impedance networks are connected between the plates at 1.0 in. spacings about a periphery of the structure.
Figure 34:
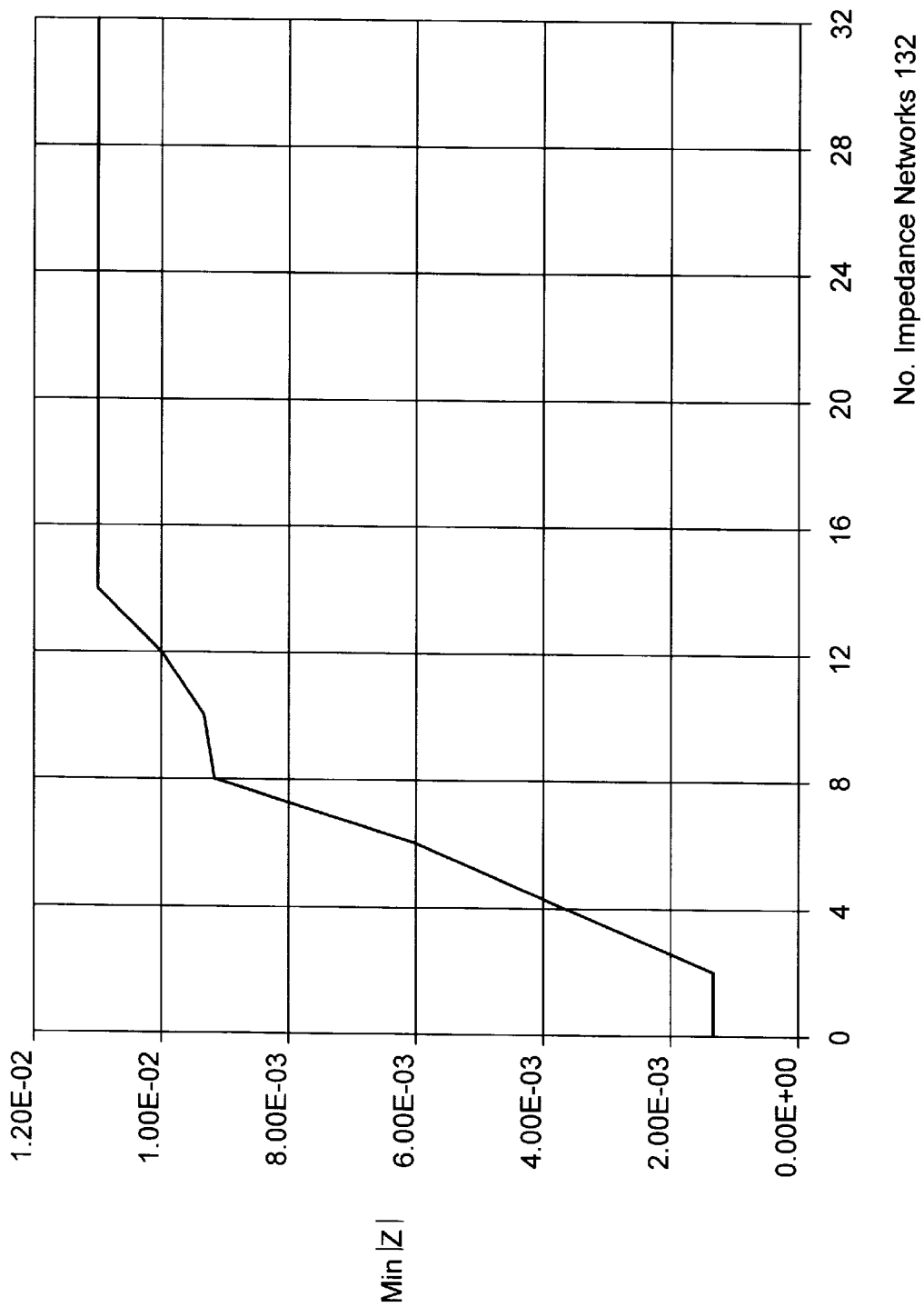

FIGS. 33–34 will now be used to show the simulated effects of eliminating impedance networks along the periphery of a rectangular structure on the beneficial impedance-stabilizing effects of edge termination FIG. 33 is a top plan view of a structure 130 including a pair of 8 in.×8 in. square conductive plates separated by a dielectric layer. Each conductive plate or sheet is made of copper and 0.0014 in. thick. The dielectric layer separating the planes has a relative dielectric constant of 4.7 and a thickness or height h of 0.002 in. The selected spacings s were 1.0 in. A total of 32 impedance networks 132 are dispersed about a region near the periphery of the upper surface of structure 130 and numbered consecutively from one corner of structure 130 as indicated in FIG. 33. A nominal electrical resistance of each impedance network 132 was computed as described above, resulting in a value of 0.348Ω.

Structure 130 was modeled as a two-dimensional grid with 1.0 in spacings s and 81 nodes connected by transmission line segments as described above. The impedances of the all 81 grid nodes of the structure 130 model were "measured" via simulation over a frequency range from 10 MHz to 1,000 MHz (i.e., 1 GHz). A first set of simulations measured the impedances of the nodes of structure 130 with all 32 impedance networks 132 intact and having resistance values equal to the calculated nominal value. A second set of simulations measured the impedances of the nodes of structure 130 with 31 impedance networks 132 intact and the impedance network 132 numbered "1" in FIG. 33 removed. Prior to the second set of simulations, the resistance values of the 31 remaining impedance networks 132 were "adjusted" to the calculated nominal value times the fraction ($31/32$). A third set of simulations measured the impedances of the nodes of structure 130 with 30 impedance networks 132 intact and impedance networks 132 numbered "2" and "1" in FIG. 33 removed. The resistance values of the remaining impedance networks 132 were "adjusted" to the calculated nominal value times the fraction ($30/32$) prior to the third set of simulations. Impedance networks 132 were removed from structure 130, the resistance values of the remaining impedance networks 132 were adjusted, and node impedances were measured via simulation until all 32 impedance networks 132 were removed from structure 130.

A "Min" value of the magnitudes of the impedances of the nodes of structure 130 (i.e., Min |Z|) was computed as described above and used to judge the effects of eliminating impedance networks in succession along the periphery of structure 130 on the beneficial impedance-stabilizing effects of edge termination. First, at each simulation frequency, the lowest value of the magnitudes of the impedances of the 81 grid nodes of the structure 130 model was determined. Second, the lowest impedance magnitude value over the entire range of simulation frequencies (i.e., Min |Z|) was determined.

FIG. 34 is a graph of the Min |Z| values versus the number of impedance networks 132 intact (i.e., the number of "edge terminations"). Again, as impedance networks 132 were removed from structure 130, the resistance values of the remaining impedance networks 132 were adjusted as described above. FIG. 34 shows that placing only 1 or 2 impedance networks 132 along the periphery of structure 130 provides little impedance stabilization improvement over the unterminated state of structure 130. The impedance stabilization provided by impedance networks 132 is positive and nearly linear when between 3 and 8 impedance networks 132 are placed along the periphery of structure 130. Additional impedance networks in excess of 8 further improve impedance stabilization until 14 impedance networks 132 are placed along the periphery of structure 130. FIG. 34 implies that placing impedance networks 132 along the periphery of structure 130 in excess of 14 provides little or no improvement in impedance stabilization.

Numerous variations and modifications will become apparent to those skilled in the art once the above disclosure is fully appreciated. It is intended that the following claims be interpreted to embrace all such variations and modifications.

What is claimed is:

1. A method for stabilizing the electrical impedance of a structure including a pair of parallel planar conductors separated by a dielectric layer and thereby reducing an amount of electromagnetic energy radiated from the structure, the method comprising:

selecting a spacing distance dependent upon a relative dielectric constant of the dielectric layer;

generating a grid comprising two orthogonal sets of parallel lines, wherein the parallel lines of each set are separated by the spacing distance, and wherein the grid has physical dimensions greater than or equal to corresponding dimensions of the structure such that the grid completely covers the structure when overlayed upon the structure;

estimating a characteristic impedance of the structure dependent upon at least one physical dimension of the grid; and electrically coupling an electrical resistance between the planar conductors, wherein the electrical resistance has a value dependent upon the characteristic impedance of the structure.

2. The method as recited in claim 1, wherein the generating comprises selecting orthogonal first and second dimensions of the structure.

3. The method as recited in claim 2, wherein the grid has orthogonal first and second dimensions, wherein the first dimension of the grid is greater than or equal to the first dimension of the structure, and wherein the second dimension of the grid is greater than or equal to the second dimension of the structure.

4. The method as recited in claim 3, wherein the first and second dimensions of the grid are integer multiples of the spacing distance.

5. The method as recited in claim 2, wherein the selecting is accomplished such that the product of the first and second dimensions of the structure are minimized.

6. The method as recited in claim 1, wherein the spacing distance is further dependent upon a maximum frequency within a frequency range of interest.

7. The method as recited in claim 1, wherein the selecting is accomplished such that the spacing distance s is given by:

$$s \leq \frac{c}{10 f_m \sqrt{\varepsilon_r}}$$

wherein c is the speed of light, $f_m$ is a maximum frequency within a frequency range of interest, and $\varepsilon_r$ is the relative dielectric constant of the dielectric layer.

8. The method as recited in claim 1, wherein the estimating of the characteristic impedance $Z_O$ of the structure is carried out using:

$$Z_o = Z_{oo}\left(\frac{h}{w\sqrt{\varepsilon_r}}\right)$$

wherein $Z_{OO}$ is the impedance of free space, h is the thickness of dielectric layer, w is a dimension of the grid, and $\varepsilon_r$ is the relative dielectric constant of the dielectric layer.

9. The method as recited in claim 8, wherein the electrical resistance comprises a plurality of discrete electrical resistances dispersed along at least a portion of a periphery of the structure.

10. The method as recited in claim 9, wherein when the grid is square, w is set equal to the length of each side of the grid and a nominal value of each of the discrete electrical resistances is computed as $Z_O \cdot (w/s)$ where s is the spacing distance.

11. The method as recited in claim 10, wherein the value of each of the discrete electrical resistances varies within a range extending from about 0.1 times the nominal value to approximately 100 times the nominal value.

12. The method as recited in claim 9, wherein when the grid is not square, w is set equal to the spacing distance and a nominal value of each of the discrete electrical resistances is set equal to the calculated value of $Z_0$.

13. The method as recited in claim 12, wherein the value of each of the discrete electrical resistances varies within a range extending from about 0.1 times the nominal value to approximately 100 times the nominal value.

14. The method as recited in claim 1, wherein the coupling comprises:

overlaying the grid upon the structure;

selecting a location for the electrical resistance at a point within the grid where two orthogonal lines of the grid intersect near a periphery of structure; and moving the location to an adjacent portion of the periphery.

15. The method as recited in claim 14, wherein the electrical resistance comprises a plurality of discrete electrical resistances dispersed along a periphery of the structure, and wherein the moving is accomplished such that distances between adjacent discrete electrical resistances are substantially equal.

16. The method as recited in claim 1, wherein the coupling comprises coupling the electrical resistance between the planar conductors along at least a portion of a periphery of the structure.

17. The method as recited in claim 1, wherein a portion of a periphery of the structure defines a curve.

18. The method as recited in claim 1, wherein the structure is substantially rectangular and has four sides, and wherein the coupling comprises coupling the plurality of electrical resistances between the planar conductors along at least a portion of one side of the structure.

19. A method for stabilizing the electrical impedance of a structure including a pair of parallel planar conductors separated by a dielectric layer, the method comprising:

selecting a spacing distance dependent upon a relative dielectric constant of the dielectric layer;

generating a grid comprising two orthogonal sets of parallel lines, wherein the parallel lines of each set are separated by the spacing distance, and wherein the grid has a size greater than or equal to a size of the structure such that the grid completely covers the structure when overlayed upon the structure;

estimating a characteristic impedance of the structure dependent upon at least one physical dimension of the grid;

determining a resistance value for each of a plurality of discrete electrical resistances dependent upon the characteristic impedance of the structure;

overlaying the grid upon the structure;

performing the following steps for each of the discrete electrical resistances;

selecting a location for a given one of the discrete electrical resistances at a point within the grid where two orthogonal lines of the grid intersect near a periphery of the structure;

moving the location to an adjacent portion of the periphery; and coupling the given one of the discrete electrical resistances between the pair of parallel planar conductors at the location.

20. The method as recited in claim 19, wherein the periphery of the structure includes a curve.

21. The method as recited in claim 19, wherein the discrete electrical resistances are coupled between the planar conductors along at least a portion of the periphery of the structure.

22. The method as recited in claim 19, wherein the structure is substantially rectangular and has four sides, and wherein the discrete electrical resistances are coupled between the planar conductors along at least a portion of one side of the structure.

23. The method as recited in claim 19, wherein the generating comprises selecting orthogonal first and second dimensions of the structure.

24. The method as recited in claim 23, wherein the grid has orthogonal first and second dimensions, wherein the first dimension of the grid is greater than or equal to the first dimension of the structure, and wherein the second dimension of the grid is greater than or equal to the second dimension of the structure.

25. The method as recited in claim 19, wherein the spacing distance is further dependent upon a maximum frequency within a frequency range of interest.

26. The method as recited in claim 19, wherein the selecting is accomplished such that the spacing distance s is given by:

$$s \leq \frac{c}{10 f_m \sqrt{\varepsilon_r}}$$

wherein c is the speed of light, $f_m$ is a maximum frequency within a frequency range of interest, and $\varepsilon_r$ is the relative dielectric constant of the dielectric layer.

27. The method as recited in claim 19, wherein the estimating of the characteristic impedance $Z_O$ of the structure is carried out using:

$$Z_o = Z_{oo}\left(\frac{h}{w\sqrt{\varepsilon_r}}\right)$$

wherein $Z_{OO}$ is the impedance of free space, h is the thickness of dielectric layer, w is a dimension of the grid, and $\varepsilon_r$ is the relative dielectric constant of the dielectric layer.

28. The method as recited in claim 27, wherein when the grid is square, w is set equal to the length of each side of the grid and a nominal resistance value of each of the discrete electrical resistances is computed as $Z_O \cdot (w/s)$ where s is the spacing distance.

29. The method as recited in claim 28, wherein the resistance value of each of the discrete electrical resistances varies within a range extending from about 0.1 times the nominal resistance value to approximately 100 times the nominal resistance value.

30. The method as recited in claim 27, wherein when the grid is not square, w is set equal to the spacing distance and a nominal resistance value of each of the discrete electrical resistances is set equal to the calculated value of $Z_O$.

31. The method as recited in claim 30, wherein the resistance value of each of the discrete electrical resistances varies within a range extending from about 0.1 times the nominal resistance value to approximately 100 times the nominal resistance value.

32. The method as recited in claim 19, wherein the moving is accomplished such that distances between adjacent discrete electrical resistances are substantially equal.

* * * * *